US006638863B2

(12) United States Patent
Wang et al.

(10) Patent No.: US 6,638,863 B2
(45) Date of Patent: Oct. 28, 2003

(54) ELECTROPOLISHING METAL LAYERS ON WAFERS HAVING TRENCHES OR VIAS WITH DUMMY STRUCTURES

(75) Inventors: Hui Wang, Fremont, CA (US); Peihaur Yih, Newark, CA (US)

(73) Assignee: ACM Research, Inc., Fremont, CA (US)

(*) Notice: Subject to any disclaimer, the term of this patent is extended or adjusted under 35 U.S.C. 154(b) by 0 days.

(21) Appl. No.: 10/108,614

(22) Filed: Mar. 27, 2002

(65) Prior Publication Data

US 2002/0175419 A1 Nov. 28, 2002

Related U.S. Application Data

(60) Provisional application No. 60/286,273, filed on Apr. 24, 2001.

(51) Int. Cl.$^7$ ............................................... H01L 21/302
(52) U.S. Cl. ........................................ 438/690; 438/626
(58) Field of Search ................................. 438/690–693, 438/626–628

(56) References Cited

U.S. PATENT DOCUMENTS

| | | |
|---|---|---|
| 4,127,459 A | 11/1978 | Jumer |
| 4,190,513 A | 2/1980 | Jumer |
| 6,186,864 B1 | 2/2001 | Fisher, Jr. et al. |
| 6,232,231 B1 | 5/2001 | Sethuraman et al. |
| 6,234,870 B1 | 5/2001 | Uzoh et al. |
| 6,309,956 B1 | 10/2001 | Chiang et al. |
| 6,315,883 B1 * | 11/2001 | Mayer et al. ............... 205/123 |
| 6,413,403 B1 | 7/2002 | Lindquist et al. |
| 6,424,042 B1 * | 7/2002 | Kitani ........................ 257/752 |
| 2002/0061608 A1 | 5/2002 | Kuroda et al. |
| 2002/0074238 A1 | 6/2002 | Mayer et al. |
| 2002/0153097 A1 | 10/2002 | Basol et al. |

* cited by examiner

Primary Examiner—Jey Tsai
(74) Attorney, Agent, or Firm—Morrison & Foerster, LLP

(57) ABSTRACT

In electropolishing a metal layer on a semiconductor wafer, a dielectric layer is formed on the semiconductor wafer. The dielectric layer is formed with a recessed area and a non-recessed area. A plurality of dummy structures are formed within the recessed areas where the dummy structures are inactive areas configured to increase the planarity of a metal layer subsequently formed on the dielectric layer. A metal layer is then formed to fill the recessed area and cover the non-recessed area and the plurality of dummy structures. The metal layer is then electropolished to expose the non-recessed area.

82 Claims, 32 Drawing Sheets

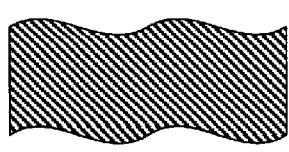 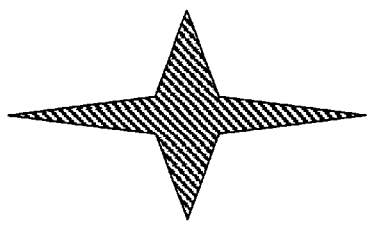 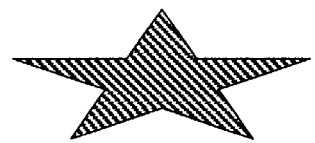
Fig. 17P        Fig. 17Q        Fig. 17R
  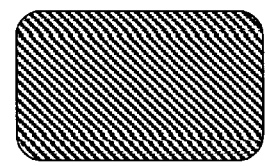
Fig. 17S        Fig. 17T        Fig. 17U
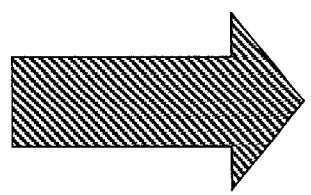  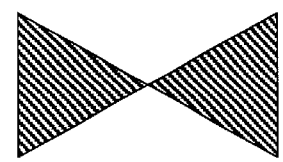
Fig. 17V        Fig. 17W        Fig. 17X
  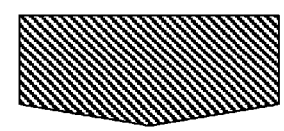
Fig. 17Y        Fig. 17Z        Fig. 17AA

ELECTROPOLISHING METAL LAYERS ON WAFERS HAVING TRENCHES OR VIAS WITH DUMMY STRUCTURES

CROSS-REFERENCE TO RELATED APPLICATIONS

The present application claims priority of an earlier filed provisional application U.S. Ser. No. 60/286,273, entitled ELECTROPOLISHING METAL LAYERS ON WAFERS HAVING TRENCHES OR VIAS WITH DUMMY STRUCTURES, filed on Apr. 24, 2001, the entire content of which is incorporated herein by reference.

BACKGROUND

1. Field of the Invention

The present invention generally relates to semiconductor wafers. More particularly, the present invention relates to dummy structures in trenches or vias of semiconductor wafers.

2. Description of the Related Art

In general, semiconductor devices are manufactured or fabricated on disks of semiconducting materials called wafers or slices. More particularly, wafers are initially sliced from a silicon ingot. The wafers then undergo multiple masking, etching, and deposition processes to form the electronic circuitry of semiconductor devices.

In particular, multiple masking and etching processes can be used to form recessed areas in a wafer, such as trenches, vias, and the like. In some applications, these recessed areas can form wide trenches. Deposition processes can be used to deposit metal onto both the wide trenches and non-recessed areas of the wafer. After deposition, the metal can be removed from the non-recessed areas of the wafer, such that the metal left in the wide trenches can form interconnections. However, because of the width of the wide trenches, when the metal is removed from the non-recessed areas, a portion of the metal deposited in the wide trenches can also be removed beyond a desirable depth. This over-removal, called dishing, can reduce the cross-sectional area of the interconnections, thereby increasing the resistance of the interconnections. This increased resistance can cause reliability problems in the semiconductor device.

Accordingly, forming dummy structures within the wide trenches has been used to reduce dishing when chemical mechanical polishing (CMP) is used to remove the metal from the non-recessed areas of the wafer. In particular, the dummy structures can prevent a CMP polishing pad from moving past the dummy structures and overpolishing metal in the wide trenches. However, dishing can still occur if electropolishing is used to remove metal from the non-recessed areas, even when the wide trenches include dummy structures.

SUMMARY

The present invention relates to electropolishing a metal layer on a semiconductor wafer. In one embodiment of the present invention, a dielectric layer is formed on the semiconductor wafer. The dielectric layer is formed with a recessed area and a non-recessed area. A plurality of dummy structures are formed within the recessed area, where the dummy structures are inactive areas configured to increase the planarity of a metal layer subsequently formed on the dielectric layer. A metal layer is then formed to fill the recessed area and cover the non-recessed area and the plurality of dummy structures. The metal layer is then electropolished to expose the non-recessed area. In one embodiment, a portion of the non-recessed area is then removed.

DESCRIPTION OF THE DRAWING FIGURES

The present invention can be best understood by reference to the following detailed description taken in conjunction with the accompanying drawing figures, in which like parts may be referred to by like numerals:

Figure 17A:
Figure 17B:
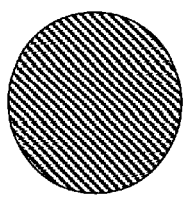
Figure 17C:
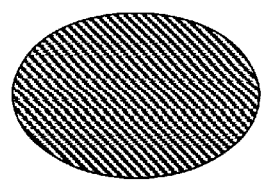
Figure 17D:
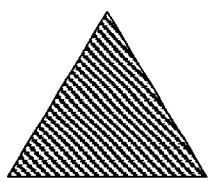
Figure 17E:
Figure 17F:
Figure 17G:
Figure 17H:
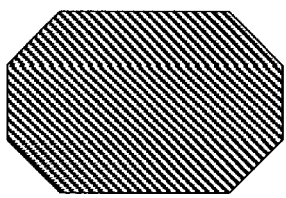
Figure 17I:
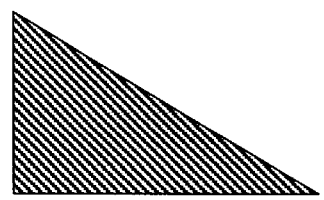
Figure 17J:
Figure 17K:
Figure 17L:
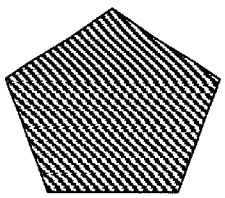
Figure 17M:
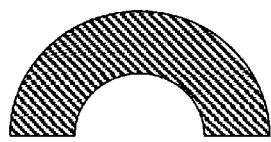
Figure 17N:
Figure 17O:
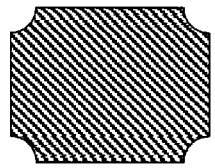
Figure 19A:
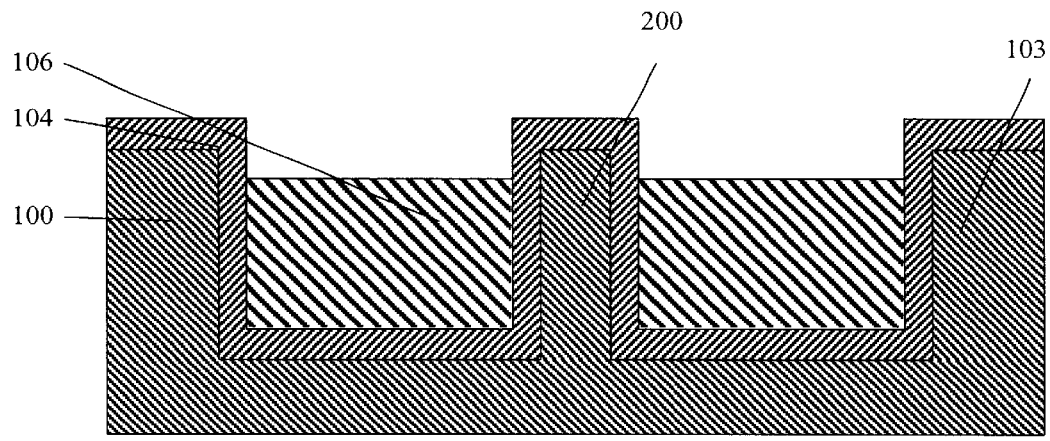
Figure 19B:
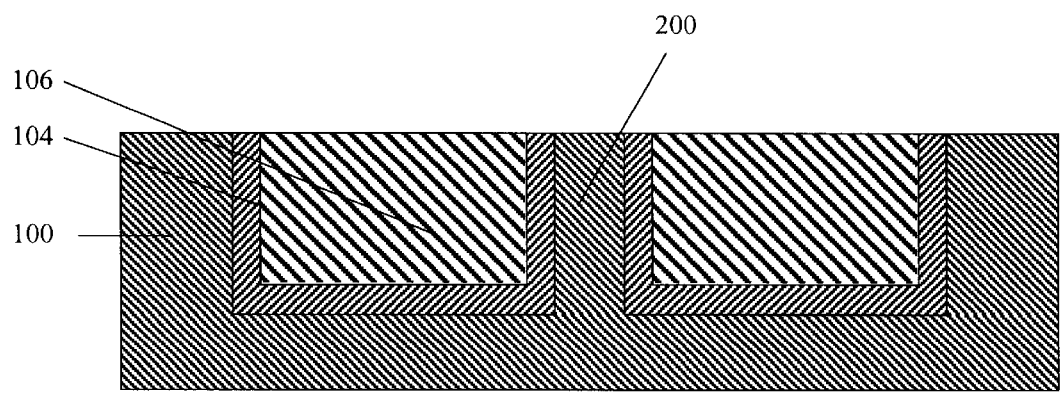
Figure 19C:
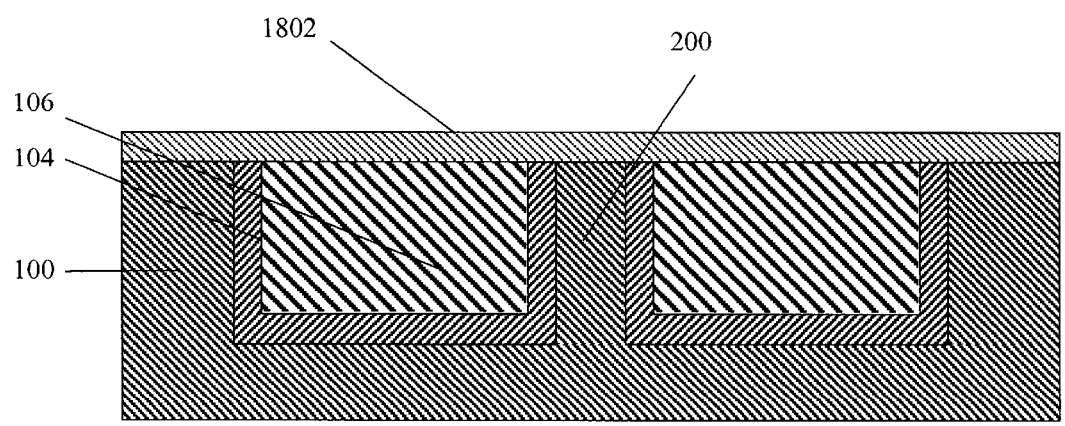
Figure 20A:
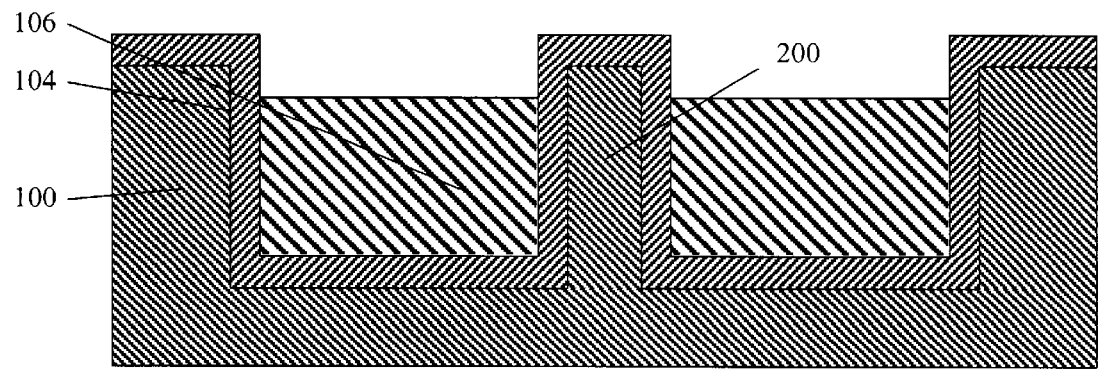
Figure 20B:
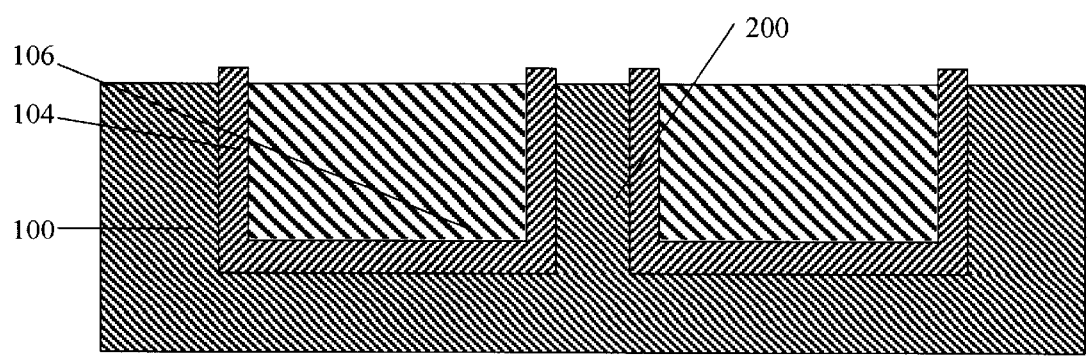
Figure 20C:
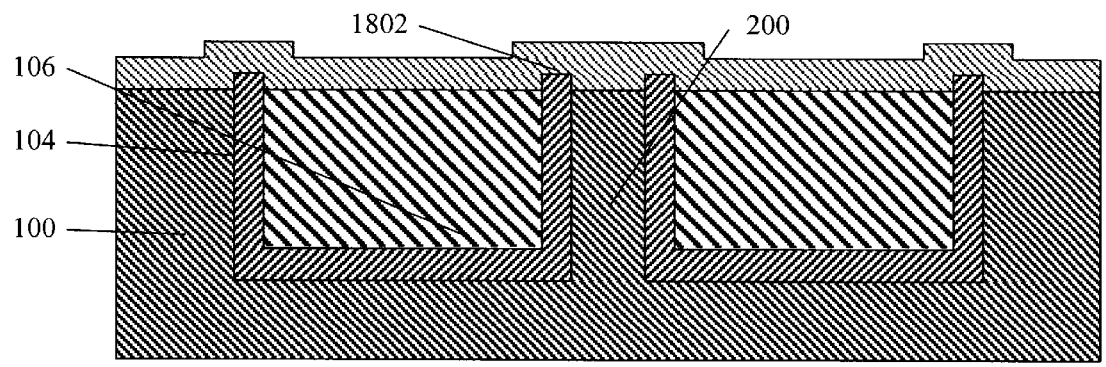

FIGS. 17A to 17AA illustrate various exemplary shapes that can be used to form dummy structures;

FIGS. 18A to 18E illustrate, in cross-sectional view, an exemplary damascene process;

FIGS. 19A to 19C illustrate, in cross-sectional view, another exemplary damascene process;

FIGS. 20A to 20C illustrate, in cross-sectional view, another exemplary damascene process;

FIGS. 21A to 21D illustrate, in cross-sectional view, another exemplary damascene process;

FIGS. 22A to 22D illustrate, in cross-sectional view, another exemplary damascene process;

FIGS. 23A to 23D illustrate, in cross-sectional view, another exemplary damascene process;

FIGS. 24A to 24D illustrate, in cross-sectional view, another exemplary damascene process;

FIGS. 25A to 25D illustrate, in cross-sectional view, another exemplary damascene process;

FIGS. 26A to 26D illustrate, in cross-sectional view, another exemplary damascene process; and FIGS. 27A to 27D illustrates, in cross-sectional view, another exemplary damascene process.

DETAILED DESCRIPTION

In order to provide a more thorough understanding of the present invention, the following description sets forth numerous specific details, such as specific configurations, parameters, examples, and the like. It should be recognized, however, that such description is not intended as a limitation on the scope of the present invention, but is intended to provide a better description of the exemplary embodiments.

FIG. 1 depicts an exemplary damascene process that can be used to form interconnections in a semiconductor device that includes a recessed area having a large width, area, and the like. In particular, with reference to FIG. 1A, the semiconductor device can include dielectric 100 having recessed area 102 and non-recessed area 103, where recessed area 102 can be a structure such as a wide trench, a large rectangular structure, and the like. In addition, dielectric 100 can include materials such as silicon dioxide, and the like, or materials having dielectric constants lower than silicon dioxide, such as fluorinated silicate glass, polyimides, fluorinated polyimides, hybrid/composites, siloxanes, organic polymers, [alpha]—C:F, Si—O—C, parylenes/fluorinated parylenes, polyterafluoroethylene, nanoporous silica, nanoporous organic, and the like. Materials having dielectric constants lower than silicon dioxide can be used to lower the capacitance between metal interconnections in the semiconductor device.

Figure 1A:
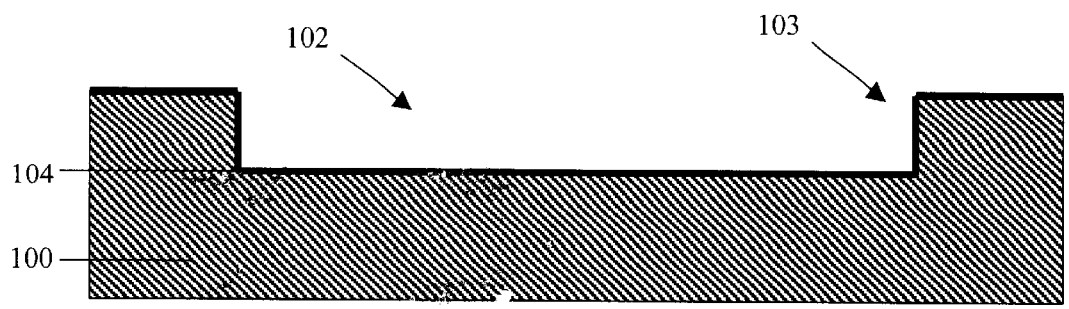
FIGS. 1A to 1D illustrate, in cross-sectional view, an exemplary damascene process.
Figure 1B:
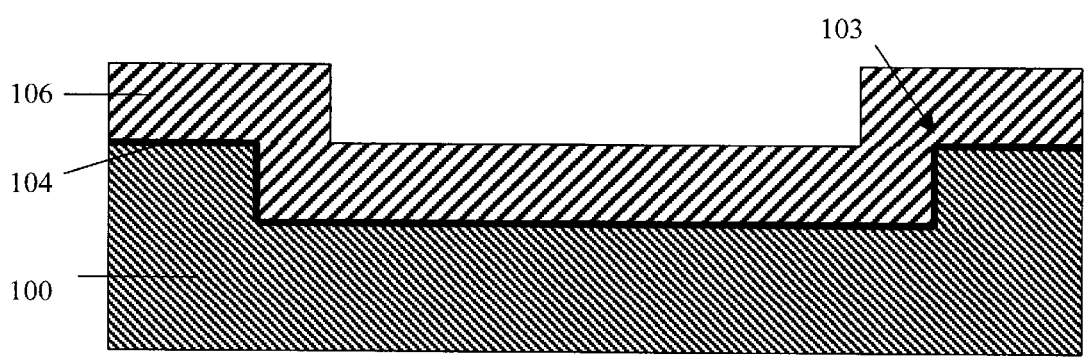

In the present exemplary process, a barrier layer 104 can be deposited on dielectric 100 by any convenient deposition method, such as chemical vapor deposition (CVD), physical vapor deposition (PVD), atomic layer deposition (ALD), and the like, such that barrier layer 104 covers both recessed area 102 and non-recessed area 103. Because dielectric 100 can have a porous microstructure, barrier layer 104 can include materials that can prevent the diffusion or leaching of a subsequently deposited metal layer 106 (FIG. 1B) into dielectric 100, as described below. Furthermore, barrier layer 104 can be formed from a conductive material, which adheres to both dielectric 100 and metal layer 106 (FIG. 1B). For instance, barrier layer 104 can include materials such as titanium, tantalum, tungsten, titanium nitride, tantalum nitride, tungsten nitride, tantalum silicon nitride, tungsten silicon nitride, and the like. However, it should be recognized that barrier layer 104 can be omitted in some applications. For example, when dielectric 100 is formed from a material that is resistant to the diffusion of a subsequently formed metal layer 106, or when the diffusion of a subsequently formed metal layer 106 will not adversely affect the performance of the semiconductor device, barrier layer 104 can be omitted.

Next, with reference to FIG. 1B, metal layer 106 can be deposited onto barrier layer 104 by any convenient method, such as PVD, CVD, ALD, electroplating, electroless plating, and the like. Furthermore, in some applications, such as when plating is used to deposit metal layer 106, a seed layer can be deposited onto barrier layer 104 before depositing metal layer 106. The seed layer can be deposited by any convenient method, such as CVD, PVD, ALD, and the like. The seed layer can include the same material as metal layer 106 in order to facilitate the deposition and bonding of metal layer 106 onto barrier layer 104 or dielectric 100 if no barrier layer 104 is used. As shown, metal layer 106 can fill recessed area 102 and cover non-recessed area 103. Additionally, metal layer 106 can include various electrically conductive materials, such as copper, aluminum, nickel, chromium, zinc, cadmium, silver, gold, rhodium, palladium, platinum, tin, lead, iron, indium, super-conductor materials, and the like. Preferably, metal layer 106 can include copper. Furthermore, it should be recognized that metal layer 106 can include an alloy of any of the various electrically conductive materials, or compound of superconductor.

Figure 1C:
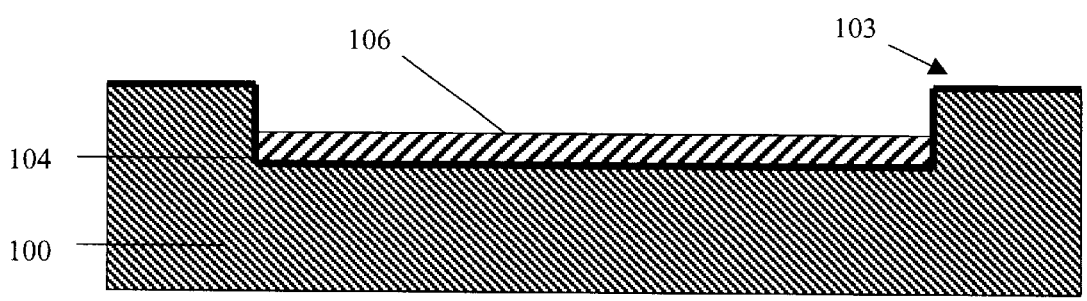

Now with reference to FIG. 1C, after metal layer 106 is deposited, metal layer 106 can then be removed from non-recessed area 103 by any convenient method, such as CMP, electropolishing, and the like. It should be recognized that polishing metal layer 106 from non-recessed area 103 can include removing metal layer 106 from the non-recessed area of any intermediate layer, such as barrier layer 104 and the like, that is deposited onto dielectric 100. For a description of electropolishing, see U.S. patent application Ser. No. 09/497,894, entitled METHODS AND APPARATUS FOR ELECTROPOLISHING METAL INTERCONNECTIONS ON SEMICONDUCTOR DEVICES, filed on Feb. 4, 2000, which is incorporated in its entirety herein by reference.

Figure 1D:
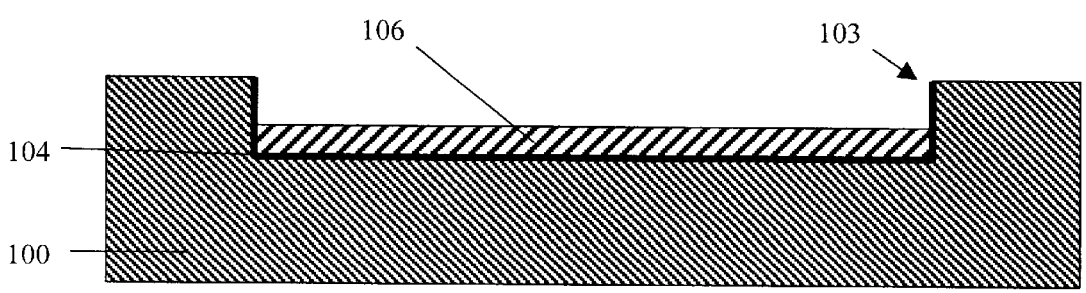

With reference to FIG. 1D, after removing metal layer 106 from non-recessed area 103, barrier layer 104 can be removed from non-recessed area 103 by any convenient method such as wet etching, dry chemical etching, dry plasma etching, CMP, and the like. Specifically, if plasma etching is used, either anisotropic etching or isotropic etching can be used. Furthermore, the etching gas used for plasma etching can include a single gas or a combination of gases such as $CF_4$, $SF_6$, $C_4F_8$, $O_2$, Ar, CO, and the like. If dry chemical etching is used, vapor gases such as HF, $H_2O$, $NH_4F$, $N_2$, and the like, can be used, where $N_2$ can be used to bubble HF liquid (49% concentration) in order to generate HF and $H_2O$ vapor. If wet etching is used, etching liquids such as HF, $NH_4F$, and the like, can be used.

As shown in the present exemplary process, when metal layer 106 is removed from non-recessed area 103, a portion of metal layer 106 can be removed, or overpolished, from recessed area 102, thereby causing the surface of metal layer 106 within recessed area 102 to be uneven with non-recessed area 103. This overpolishing of metal layer 106 within recessed area 102, or dishing, can occur because of the large width of recessed area 102. This dishing can reduce the cross-sectional area of the metal layer 106 within recessed area 102, and can therefore increase the resistance of the interconnection formed by metal layer 106. This increased resistance can cause the semiconductor device to malfunction.

Accordingly, as shown in FIGS. 2A–2D, dummy structures 200 can be included in recessed area 102 to reduce the unevenness of metal layer 106 with non-recessed area 103. However, as described below, dishing within the recessed area between each dummy structure 200 can still occur if metal layer 106 is overpolished when using an electropolishing method.

The process shown in FIGS. 2A–2D is similar in many respects to the process shown in FIGS. 1A–1D, except that dummy structures 200 are included in recessed area 102. In particular, with reference to FIG. 2A, dummy structures 200 can be included in recessed area 102 of dielectric 100. Dummy structures 200 can form a part of non-recessed area 103 and can include the same material as dielectric 100 or can include any other material, depending on the application. For instance, dummy structures can include materials such as silicon dioxide, and the like, materials having dielectric constants lower than silicon dioxide, such as fluorinated silicate glass, polyimides, fluorinated polyimides, hybrid/composites, siloxanes, organic polymers, [alpha]—C:F, Si—O—C, parylenes/fluorinated parylenes, polyterafluoroethylene, nanoporous silica, nanoporous organic, and the like, and metals such as copper, aluminum, nickel, chromium, zinc, cadmium, silver, gold, rhodium, palladium, platinum, tin, lead, iron, indium, and the like.

If dummy structures 200 are formed of the same material as dielectric 100, then dummy structures 200 can be formed at the same time that recessed area 102 is formed. However, it should be recognized that even if dummy structures 200 are formed of the same material as dielectric 100, dummy structures can also be formed after recessed area is formed. Alternatively, if dummy structures 200 are formed of a different material than dielectric 100, then dummy structures 200 can be formed after recessed area 102 is formed. For instance, after recessed area 102 is formed, a metal, such as aluminum, and the like, can be deposited in the recessed area. This metal can then be masked and etched to form dummy structures 200, which are made of metal.

Figure 2A:
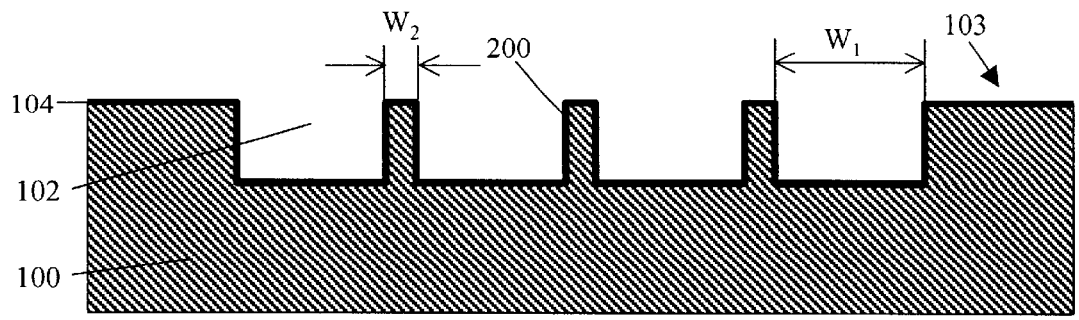
FIGS. 2A to 2D illustrate, in cross-sectional view, another exemplary damascene process.
Figure 2B:
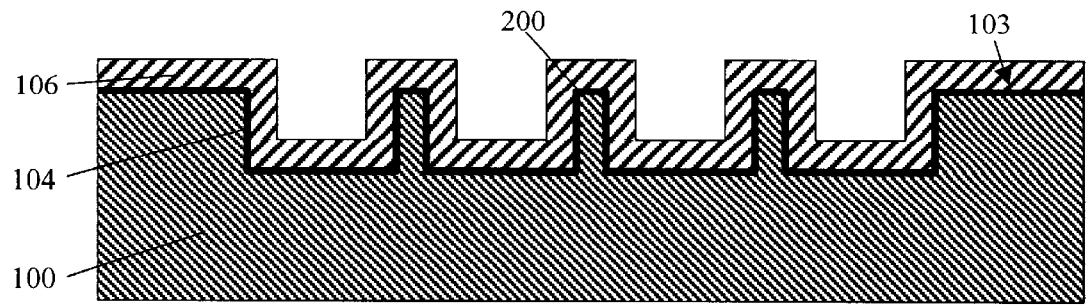
Figure 2C:
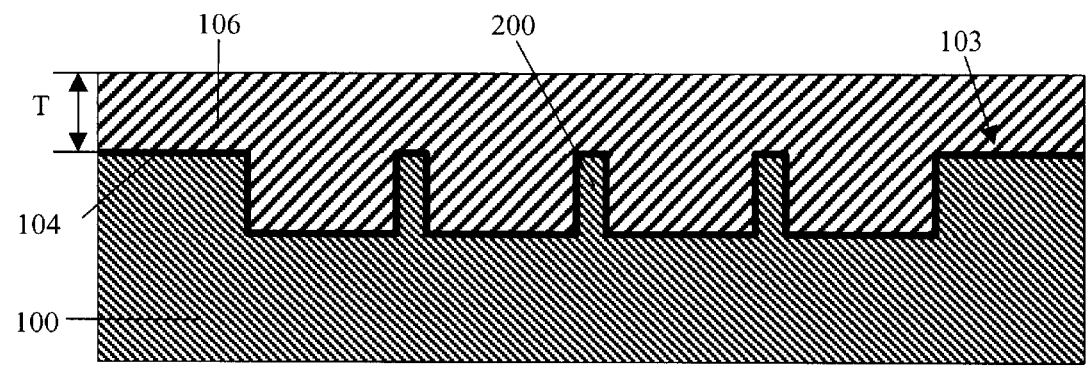

The number of dummy structures 200 included in recessed area 102 and the distance $W_1$ between dummy structures 200 can affect the planarity of the metal layer deposited onto the semiconductor device, as shown in FIG. 2C. Accordingly, the ratio of the distance $W_1$ between dummy structures 200 to the thickness T of the metal layer deposited on non-recessed area 103 ($W_1/T$) can be chosen in the range of about 1 to about 5, and preferably less than about 2. It should be recognized, however, that this ratio can fall outside of this range depending on the particular application. Furthermore, it should be recognized that any number of dummy structures can be used depending on the application.

Although $W_1$ can affect the planarity of the metal layer deposited, the width $W_2$ of the dummy structures 200 typically does not affect the planarity of the metal layer deposited. However, $W_2$ can affect the effective cross-sectional area of the interconnection formed by the metal layer 106 deposited in recessed area 102. Accordingly, $W_2$ can be reduced in order to increase the effective cross-sectional area of the interconnection. In particular, the ratio of the width $W_2$ of the dummy structures 200 to the thickness T of the metal layer deposited on non-recessed area 103 ($W_2/T$) can be chosen in the range of about 0.1 to about 1, and preferably about 0.3. It should be recognized, however, that this ratio can fall outside of this range depending on the particular application.

In the present exemplary process, after dummy structures 200 are included in recessed area 102, barrier layer 104 can be deposited, such that barrier layer 104 covers both recessed area 102 and non-recessed area 103, including dummy structures 200. As described above, it should be recognized that barrier layer 104 can be omitted in some applications.

Next, with reference to FIGS. 2B and 2C, metal layer 106 can be deposited onto barrier layer 104, such that metal layer 106 fills recessed area 102 and covers non-recessed area 103. As shown in FIG. 2C, the surface of the metal layer 106 deposited over a recessed area 102 having dummy structures 200 can be more planar than a metal layer 106 deposited over a recessed area 102 without dummy structures (FIG. 1B).

Figure 2D:
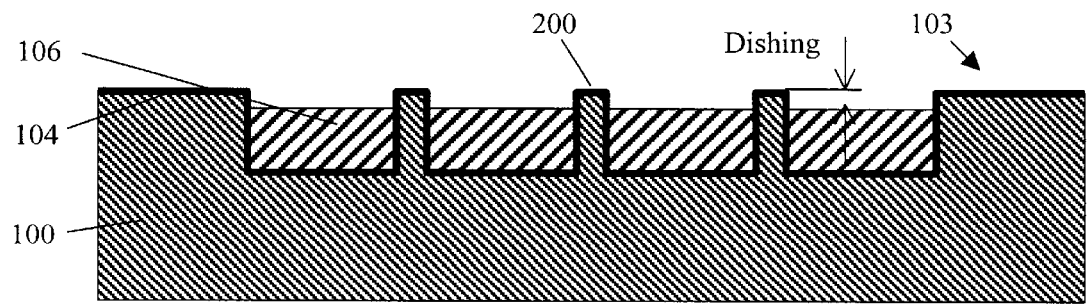

Now with reference to FIG. 2D, after metal layer 106 is deposited, metal layer 106 can then be electropolished from non-recessed area 103. However, dishing in recessed area 102 can occur if electropolishing is allowed to continue after metal layer 106 is removed from non-recessed area 103. Although a certain amount of overpolishing can be desirable in order to reduce the risk of causing shortages in adjacent interconnections, dishing can affect the planarity of the next layer deposited, such as a dielectric layer, passivation layer, cover layer, and the like. In turn, the planarity of the next layer deposited can affect subsequent processes, such as lithography and the like, used to form interconnections in subsequent layers. It should be recognized that the occurrence of dishing when dummy structures are used is specific to electropolishing. In contrast, when using only CMP to remove metal layer 106, dummy structures 200 can prevent the CMP polishing pad from moving past the dummy structures 200. Thus, the dummy structures 200 can prevent the CMP polishing pad from overpolishing metal layer 106 from recessed area 102.

Accordingly, as shown in FIG. 3, a portion of non-recessed area 103 that is uneven with metal layer 106 can be removed in order to increase the planarity of metal layer 106 with non-recessed area 103. The exemplary process depicted in FIG. 3 is similar in many respects to the process depicted in FIG. 2, except that the process depicted in FIG. 3 includes overpolishing metal layer 106 from recessed area 102 and then removing a portion of non-recessed area 103 in order to increase the planarity of the surface formed by metal layer 106 and non-recessed area 103.

Figure 3A:
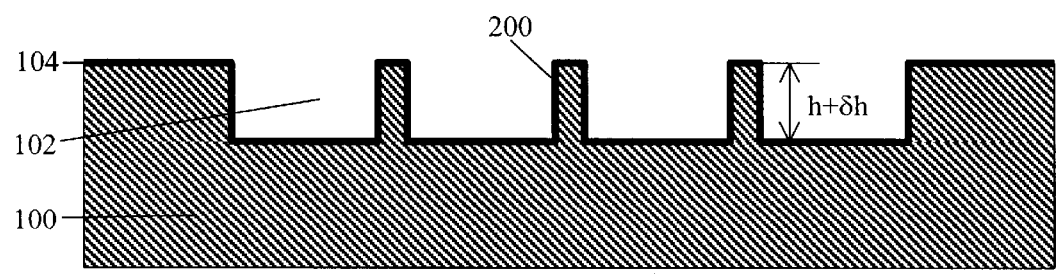
FIGS. 3A to 3E illustrate, in cross-sectional view, another exemplary damascene process.

In particular, with reference to FIG. 3A, dummy structures 200 can be included in recessed area 102 of dielectric 100, and can form part of non-recessed area 103. Recessed area 102 can have a depth of h+δh, where h is the desired height of the final metal interconnection formed in recessed area 102 and δh is the offset height, as described below. After dummy structures 200 are included in recessed area 102, barrier layer 104 can be deposited, such that barrier layer 104 covers both recessed area 102 and non-recessed area 103, including dummy structures 200. As described above, it should be recognized that barrier layer 104 can be omitted in some applications.

Figure 3B:
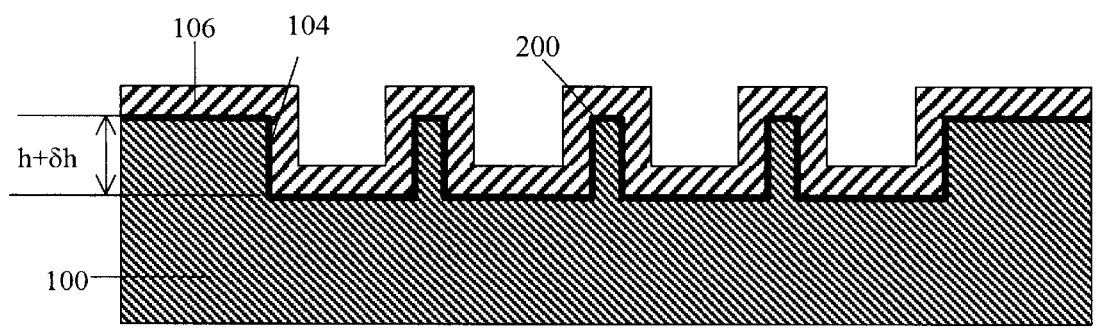
Figure 3C:
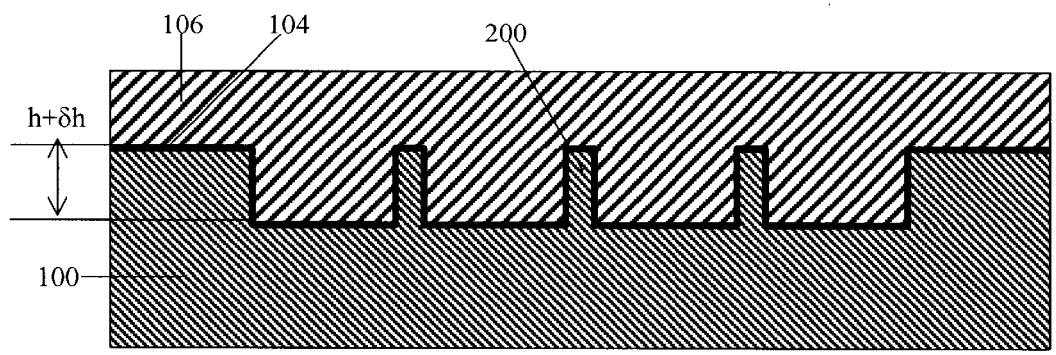
Figure 3D:
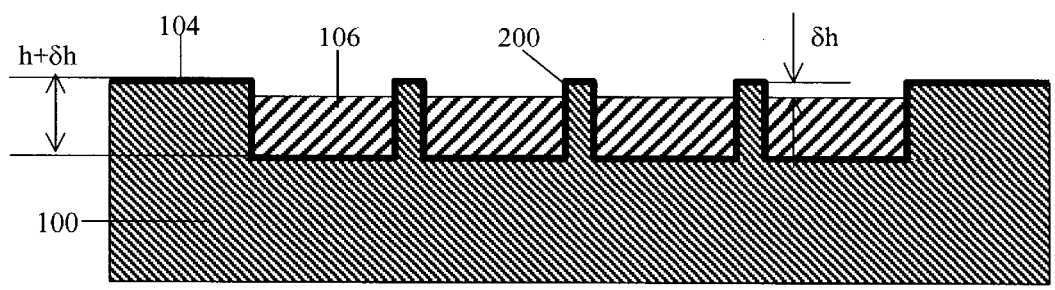

Next, with reference to FIGS. 3B and 3C, metal layer 106 can be deposited onto barrier layer 104, such that metal layer 106 fills recessed area 102 and covers non-recessed area 103. After metal layer 106 is deposited, with reference to FIG. 3D, metal layer 106 can then be electropolished from non-recessed area 103. Electropolishing metal layer 106 from non-recessed area 103 can include removing metal layer 106 from the non-recessed area of any intermediate layer, such as barrier layer 104 and the like, that is deposited onto dielectric 100. Furthermore, electropolishing can be continued until metal layer 106 is overpolished from recessed area 102 an amount δh, the offset height. According to one embodiment of of the present invention, the offset height can be chosen in the range of about 5 nm to about 100 nm. However, it should be recognized that the offset height can be any height depending on the particular application.

Figure 3E:
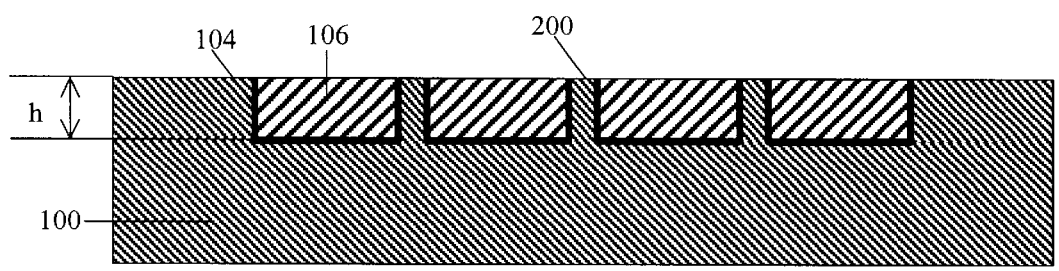

With reference now to FIG. 3E, after metal layer 106 is overpolished from recessed area 102, a portion of non-recessed area 103 that is uneven with metal layer 106 can be removed. More particularly, barrier layer 104, dielectric 100, and dummy structures 200 can be removed by any convenient method such as wet etching, dry chemical etching, dry plasma etching, and the like. Specifically, if plasma etching is used, either anisotropic etching or isotropic etching can be used. Furthermore, the etching gas used for plasma etching can include a single gas or a combination of gases such as $CF_4$, $SF_6$, $C_4F_8$, $O_2$, Ar, CO, and the like. If dry chemical etching is used, vapor gases such as HF, H$_2$O, NH$_4$F, N$_2$, and the like, can be used, where N$_2$ can be used to bubble HF liquid (49% concentration) in order to generate HF and H$_2$O vapor. If wet etching is used, etching liquids such as HF, NH$_4$F, and the like, can be used. Furthermore, if barrier layer 104 is not deposited on dielectric 100 and dummy structures 200, dielectric 100 and dummy structures 200 can be removed by using a planarization process, such as CMP, and the like. However, it should be recognized that dielectric 100 and dummy structures 200 can be removed by etching or any other convenient process.

Figure 4:
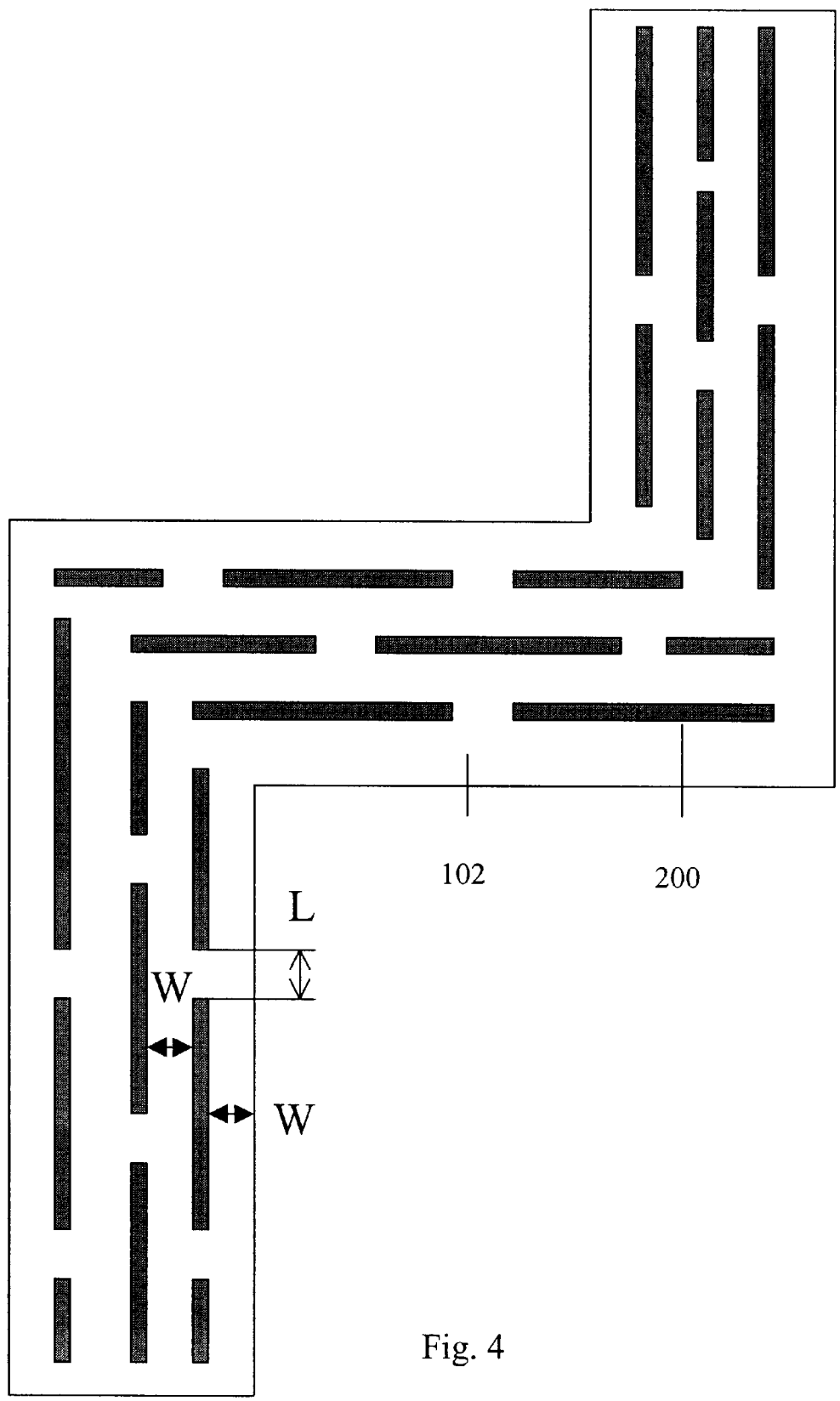
FIG. 4 illustrates an exemplary wide trench structure.

With reference to FIG. 4, an exemplary type of recessed area 100 (FIGS. 1–3) is shown. This recessed area is a wide trench structure that includes dummy structures 200, which are spaced apart at distances of L and W. As shown, dummy structures 200 can be discontinuous, such that a metal layer deposited in wide trench structure 102 can conduct current throughout the metal layer. Furthermore, dummy structures 200 can be positioned such that current can flow more uniformly across the metal layer, and thereby enhance the reliability of the interconnection formed by the metal layer. In particular, the ratio of distance L between dummy structures 402 to the thickness T of the metal layer deposited on the non-recessed area of the wide trench structure 400 (L/T) can be chosen in the range of about 1 to about 5, and preferably less than about 2. However, it should be recognized that this ratio can fall outside of this range depending on the particular application.

Figure 5:
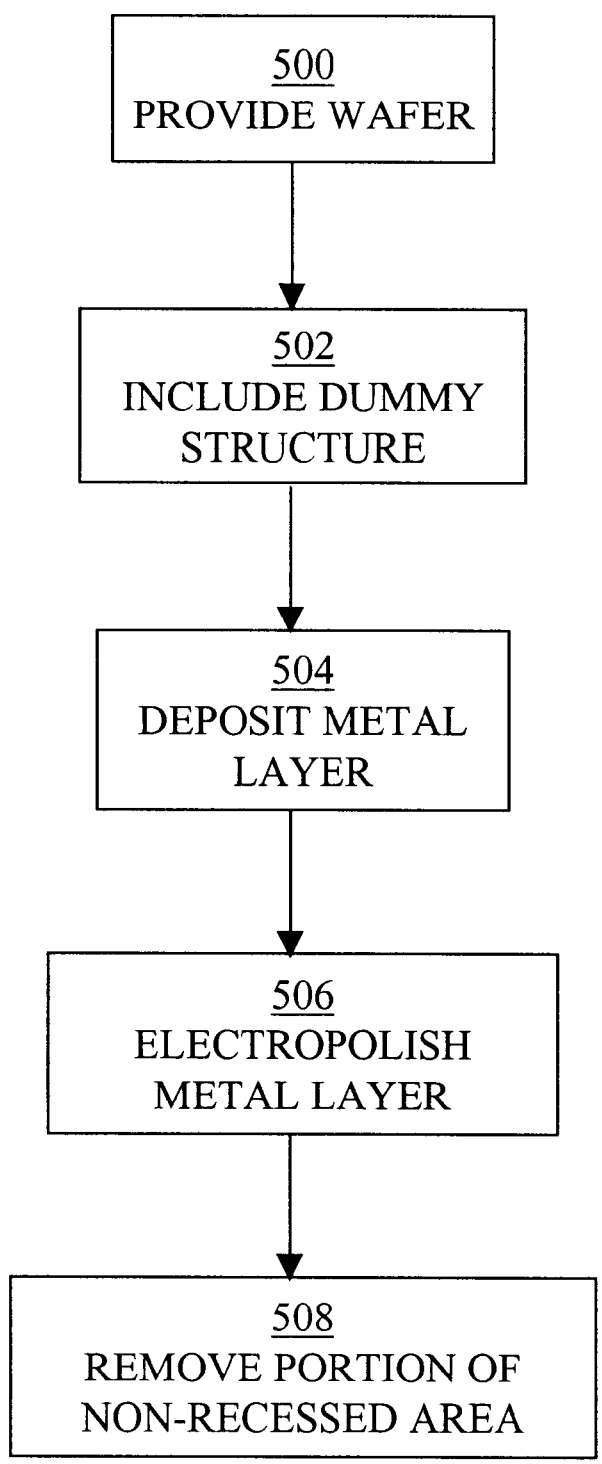
FIG. 5 is a flow chart illustrating the steps of an exemplary damascene process, in accordance with the present invention.

With reference to FIG. 5, shown is a flow chart illustrating an exemplary damascene process according to the present invention. In step 500, a wafer having recessed and non-recessed areas can be provided. In step 502, a dummy structure can be included in the recessed area to form part of the non-recessed area. In step 504, a metal layer can be deposited, such that the metal layer fills the recessed area and covers the non-recessed area. In step 506, the metal layer can be electropolished from the non-recessed area and overpolished from the recessed area. In step 508, a portion of the non-recessed area that is uneven with the metal layer in the recessed area can be removed.

It should be recognized, however, that various modifications can be made to the process depicted in the present flow chart. For example, the step of depositing a barrier layer can be added between steps 502 and 504. Additionally, it should be recognized that each of the steps depicted in FIG. 5 can include numerous steps. For example, step 504 can include depositing a seed layer before depositing a metal layer. Moreover, it should be recognized that the steps depicted in FIG. 5 can be used for any damascene process, including a single-damascene process or a dual-damascene process.

In FIG. 6, an exemplary process for forming a metal pad in a semiconductor device is shown. The process shown in FIG. 6 is similar in many respects to the process shown in FIG. 1, except that vias 602 and large rectangular structure 600 are included in the semiconductor device.

Figure 6A:
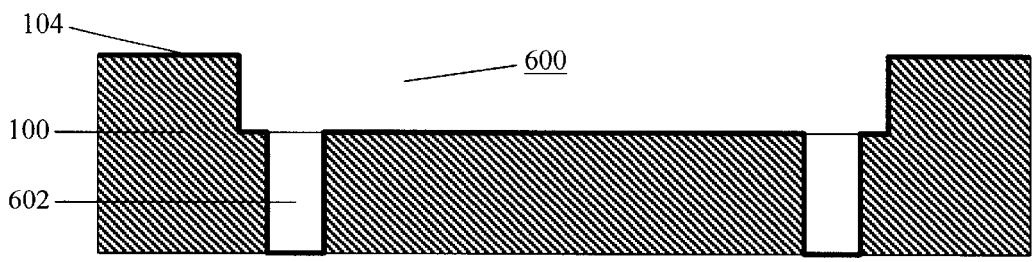
FIGS. 6A to 6E illustrate an exemplary process for forming a metal pad in a semiconductor device.
Figure 6B:
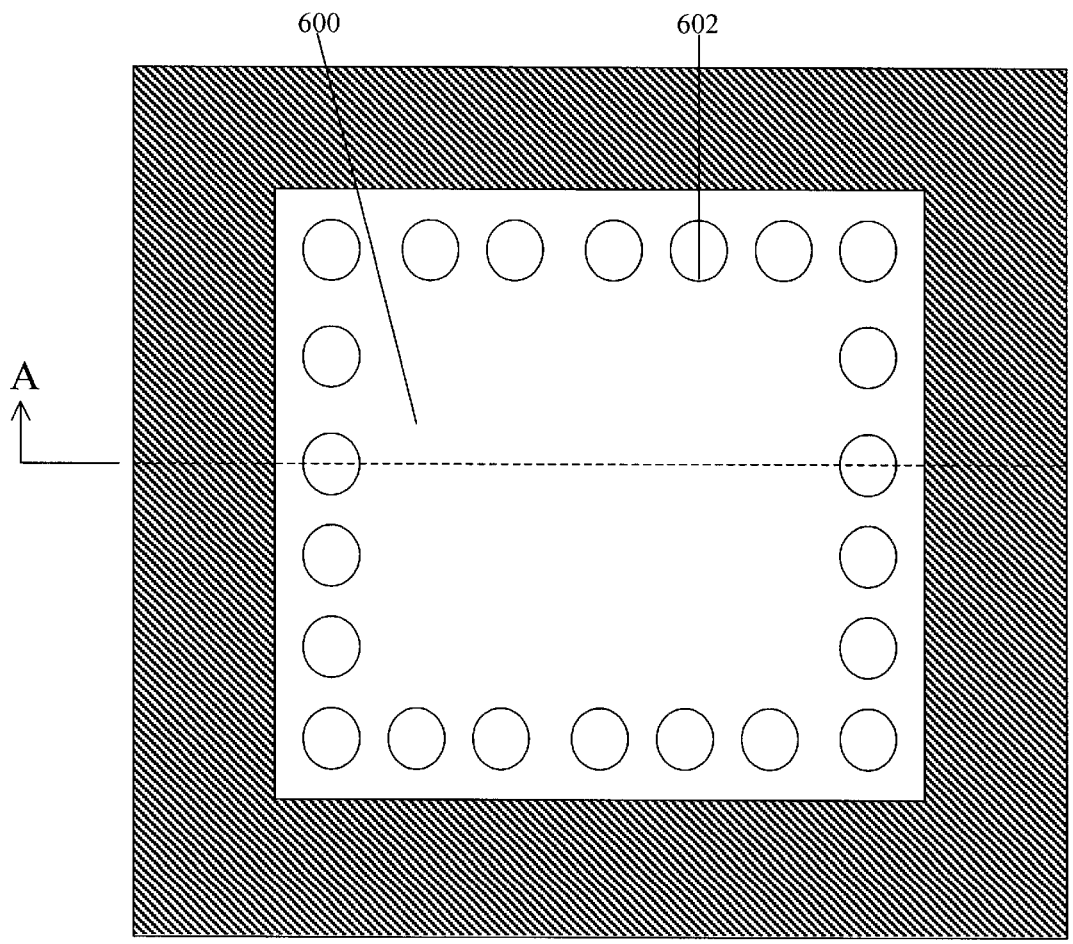

With reference now to FIGS. 6A and 6B, dielectric 100 can include a non-recessed area 103 and a recessed area that forms a large rectangular structure 600. Large rectangular structure 600 can connect with vias 602. When filled with metal layer 106, as described below, large rectangular structure 600 can form a pad. Additionally, when vias 602 are filled with metal layer 106, as also described below, vias 602 can form plugs that can conduct current from the pad to other pads or interconnections in the semiconductor device. As shown in FIG. 6A, a barrier layer 104 can be deposited on large rectangular structure 600, vias 602, and non-recessed area 103. However, as described above, barrier layer 104 can be omitted in some applications.

Figure 6C:
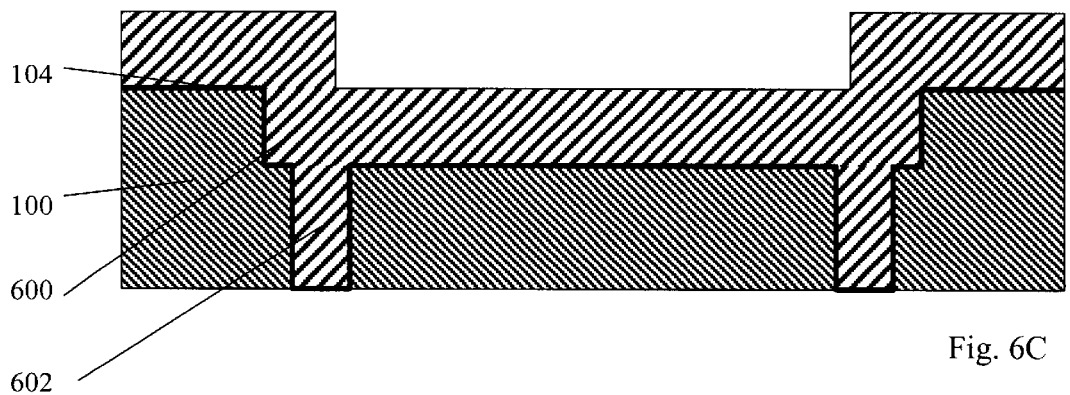

Next, with reference to FIG. 6C, metal layer 106 can be deposited onto barrier layer 104, such that metal layer 106 fills large rectangular structure 600, vias 602, and covers non-recessed area 103.

Figure 6D:
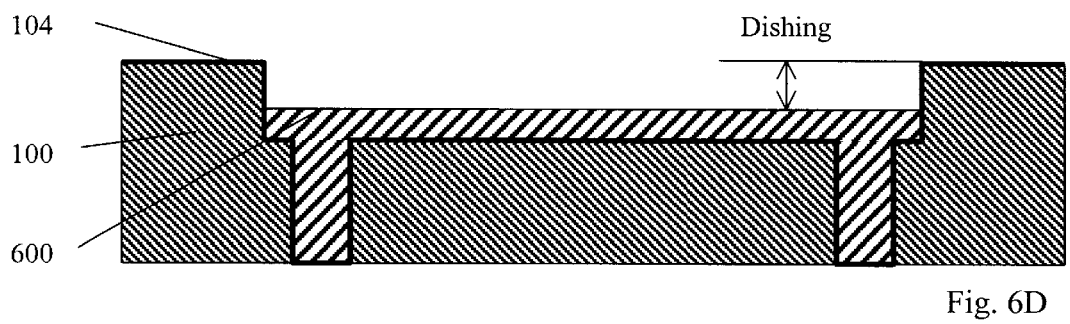
Figure 6E:
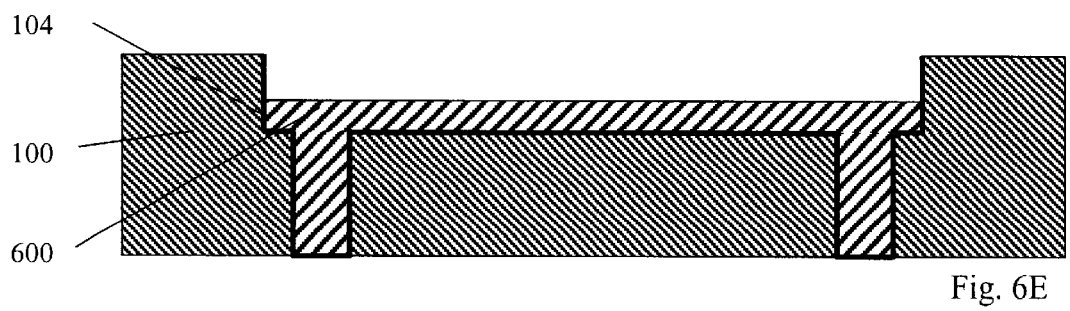

With reference to FIG. 6D, after metal layer 106 is deposited, metal layer 106 can then be removed from non-recessed area 103. Removing metal layer 106 from non-recessed area 103 can include removing metal layer 106 from the non-recessed area of any intermediate layer, such as barrier layer 104 and the like, that are deposited onto dielectric 100. After removing metal layer 106 from non-recessed area 103, with reference to FIG. 6E, barrier layer 104 can be removed from non-recessed area 103.

As shown in the present exemplary process, when metal layer 106 is removed from non-recessed area 103, a portion of metal layer 106 can be removed, or overpolished, from large rectangular structure 600, thereby causing the surface of metal layer 106 within large rectangular structure 600 to be uneven with non-recessed area 103. This overpolishing of metal layer 106 within large rectangular structure 600, or dishing, can occur because of the large size of large rectangular structure 600. This dishing can reduce the cross-sectional area of the metal layer 106 within large rectangular structure 600, and can therefore increase the resistance in the pad formed by metal layer 106. This increased resistance can cause the semiconductor device to malfunction.

Accordingly, as shown in FIG. 7, dummy structures 700 can be included in large rectangular structure 600 to reduce the unevenness of metal layer 106 with non-recessed area 103. The exemplary process depicted in FIG. 7 is similar in many respects to the process depicted in FIG. 6, except that the process depicted in FIG. 7 includes overpolishing metal layer 106 from large rectangular structure 600 and then removing a portion of non-recessed area 103 in order to increase the planarity of the surface formed by metal layer 106 and non-recessed area 103.

Figure 7A:
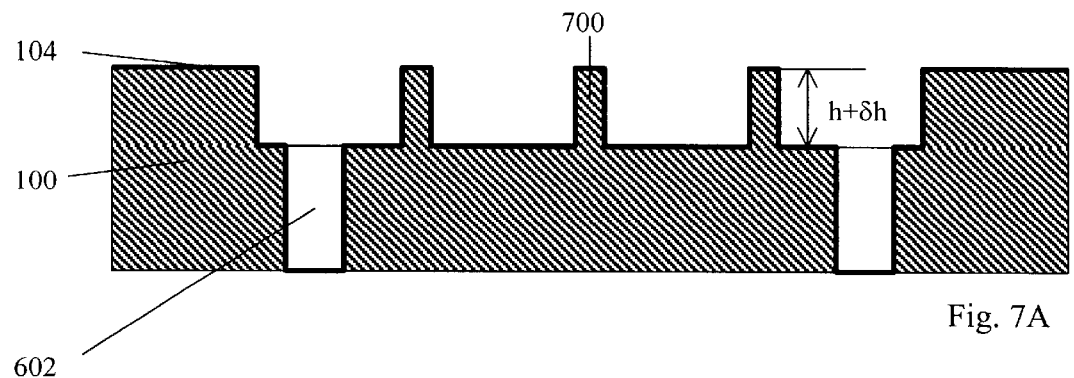
FIGS. 7A to 7E illustrate another exemplary process for forming a metal pad in a semiconductor device.
Figure 7B:
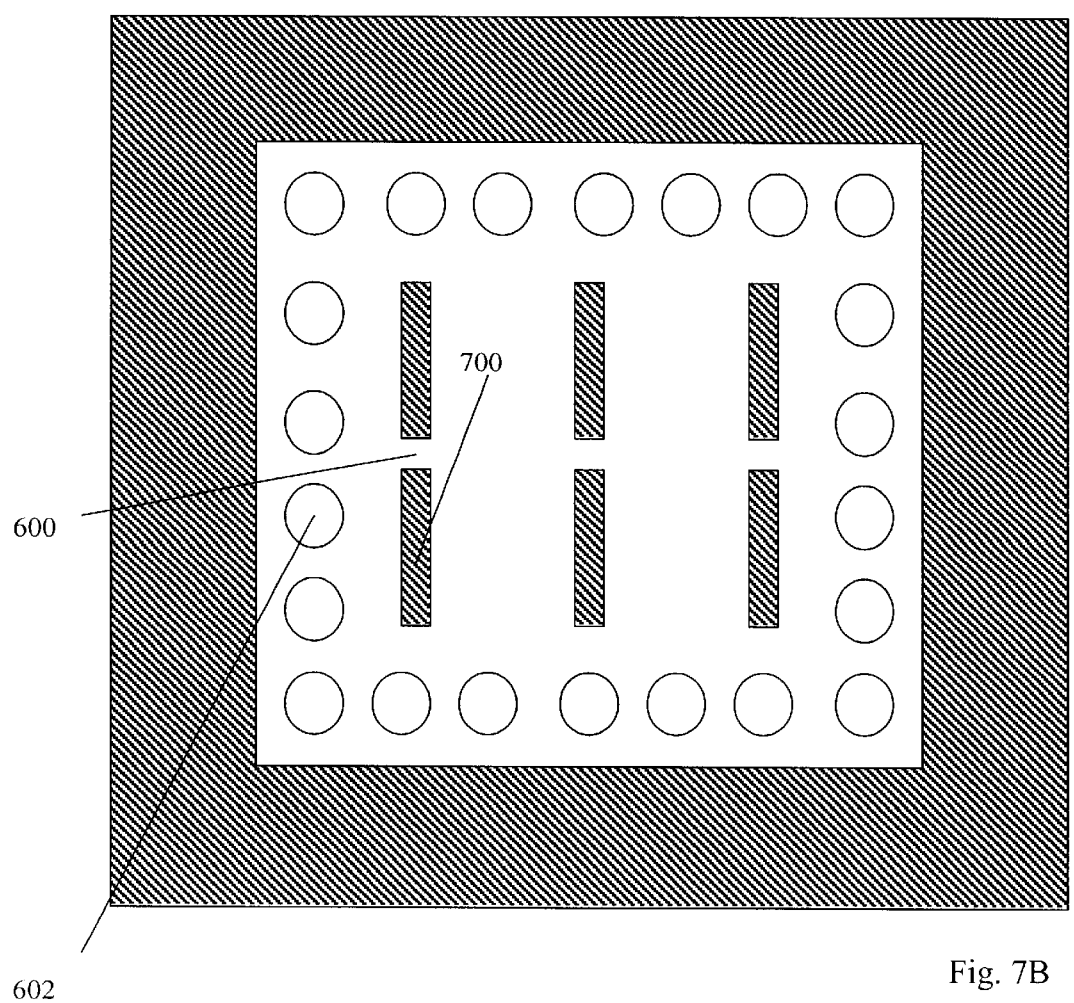

In particular, with reference to FIGS. 7A and 7B, dummy structures 700 can be included in large rectangular structure 600 of dielectric 100, and can form part of non-recessed area 103. Large rectangular structure 600 can have a depth of h+δh, where h is the desired height of the final metal interconnection and δh is the offset height, as described below. After dummy structures 700 are included in large rectangular structure 600, barrier layer 104 can be deposited, such that barrier layer 104 covers large rectangular structure 600, vias 602, and non-recessed area 103, including dummy structures 700. As described above, it should be recognized that barrier layer 104 can be omitted in some applications. Furthermore, as also described above, any number of dummy structures 700 can be used.

Figure 7C:
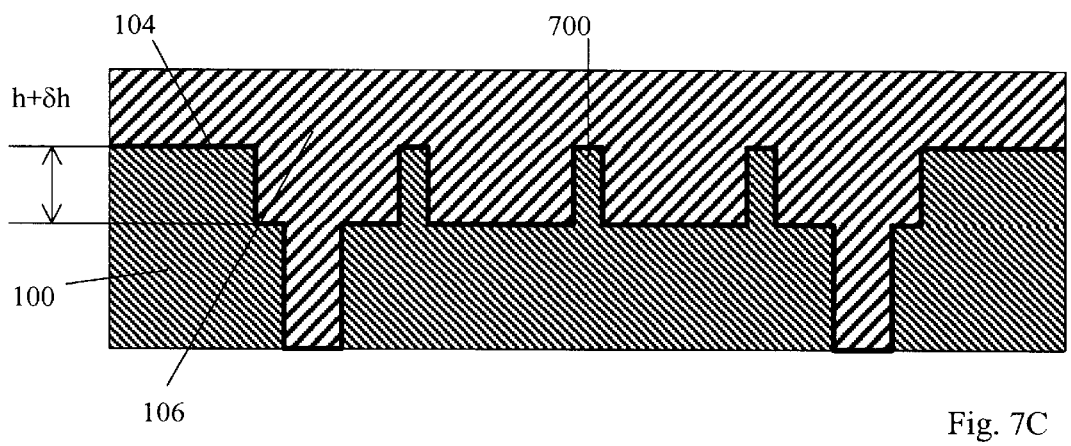
Figure 7D:
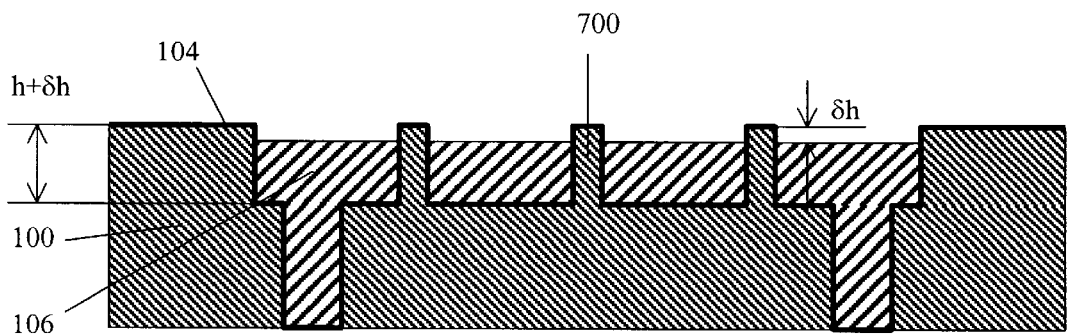

Next, with reference to FIG. 7C, metal layer 106 can be deposited onto barrier layer 104, such that metal layer 106 fills large rectangular structure 600 and vias 602 and covers non-recessed area 103. After metal layer 106 is deposited, with reference to FIG. 7D, metal layer 106 can then be electropolished from non-recessed area 103. Electropolishing metal layer 106 from non-recessed area 103 can include removing metal layer 106 from the non-recessed area of any intermediate layer, such as barrier layer 104 and the like, that is deposited onto dielectric 100. Furthermore, electropolishing can be continued until metal layer 106 is overpolished from large rectangular structure 600 an amount δh, the offset height. According to one embodiment of of the present invention, the offset height can be chosen in the range of about 5 nm to about 100 nm. However, it should be recognized that the offset height can be any height depending on the particular application.

Figure 7E:
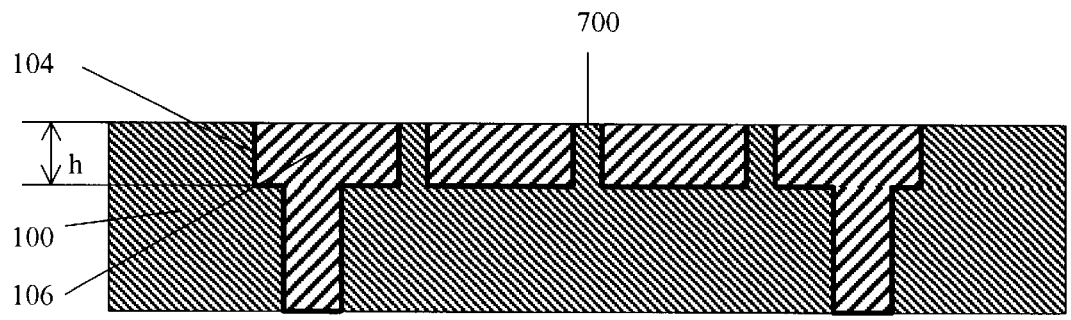

With reference now to FIG. 7E, after metal layer 106 is overpolished from large rectangular structure 600, a portion of non-recessed area 103 that is uneven with metal layer 106 can be removed. More particularly, barrier layer 104, dielectric 100, and dummy structures 700 can be removed by any convenient method such as wet etching, dry chemical etching, dry plasma etching, and the like. Specifically, if plasma etching is used, either anisotropic etching or isotropic etching can be used. Furthermore, the etching gas used for plasma etching can include a single gas or a combination of gases such as $CF_4$, $SF_6$, $C_4F_8$, $O_2$, Ar, CO, and the like. If dry chemical etching is used, vapor gases such as HF, $H_2O$, $NH_4F$, $N_2$, and the like, can be used, where $N_2$ can be used to bubble HF liquid (49% concentration) in order to generate HF and $H_2O$ vapor. If wet etching is used, etching liquids such as HF, $NH_4F$, and the like, can be used. Furthermore, if barrier layer 104 is not deposited on dielectric 100 and dummy structures 700, dielectric 100 and dummy structures 700 can be removed by using a planarization process, such as CMP, and the like. However, it should be recognized that dielectric 100 and dummy structures 700 can be removed by etching or any other convenient process.

In FIG. 8, another exemplary process is shown. The exemplary process shown in FIG. 8 is similar in many respects to the process shown in FIG. 7, except that after metal layer 106 is overpolished from large rectangular structure 600, the exposed portions of non-recessed area 103 can be etched below the surface of metal layer 106.

Figure 8A:
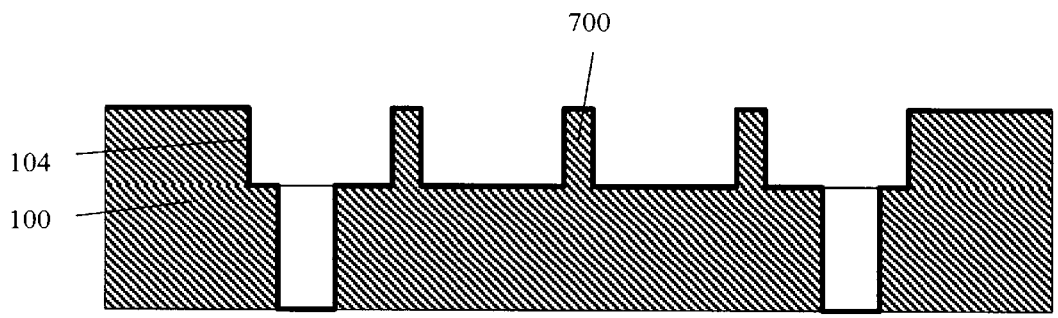
FIGS. 8A to 8D illustrate another exemplary process for forming a metal pad in a semiconductor device.
Figure 8B:
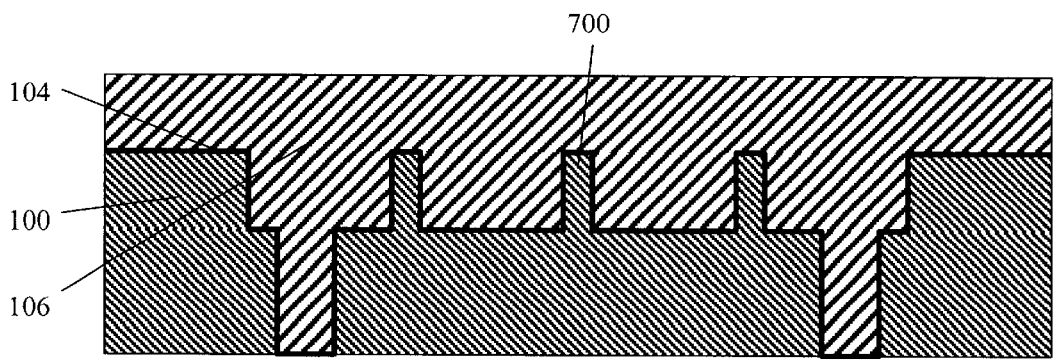
Figure 8C:
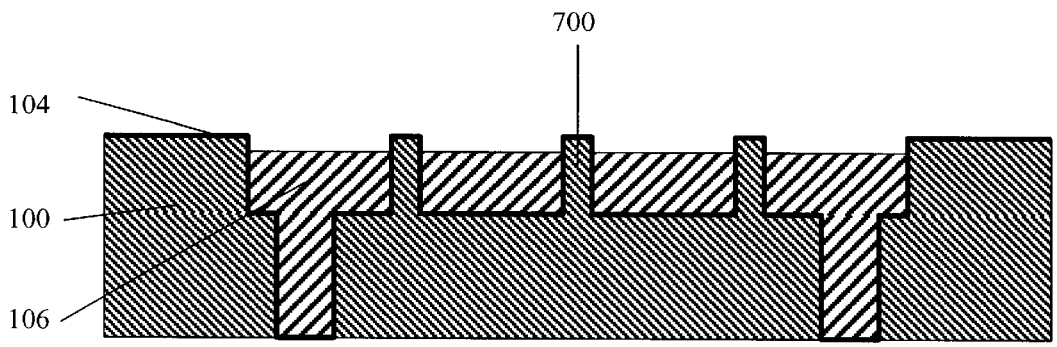

In particular, with reference to FIG. 8C, after metal layer 106 is deposited on the semiconductor device, such that metal layer 106 fills recessed area 600 and covers non-recessed area 103, metal layer 106 can then be electropolished from non-recessed area 103 until metal layer 106 is overpolished from large rectangular structure 600.

Figure 8D:
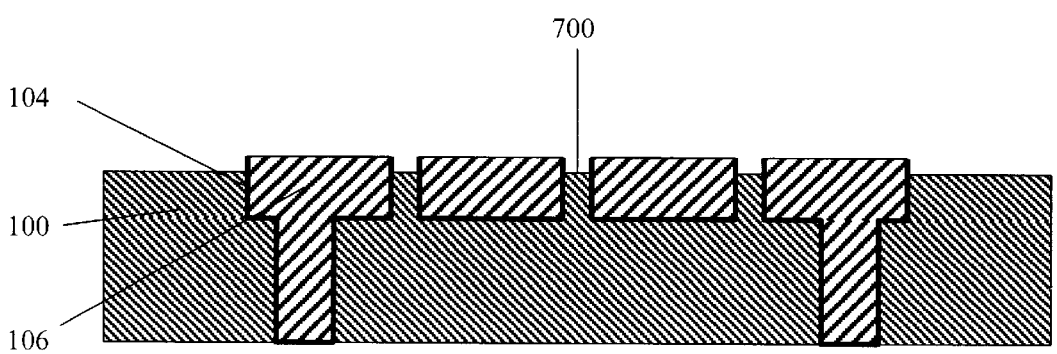

With reference now to FIG. 8D, after metal layer 106 is overpolished from large rectangular structure 600, non-recessed area 103 can be etched below the surface of metal layer 106. More particularly, barrier layer 104, dielectric 100, and dummy structures 700 can be removed by any convenient method such as wet etching, dry chemical etching, dry plasma etching, and the like. As shown in FIG. 8D, a portion of metal layer 106 can then protrude from the surface of the semiconductor device.

Although the present exemplary process is not typically useful for normal wafer production, this process can be useful for producing a wafer suitable for performing electrical testing for quality control purposes or research and development. In particular, a probe used for electrical testing can more securely and easily contact the surface of metal layer 106, thereby increasing the conductivity between the pad of the semiconductor device and the probe of the electrical testing device. This increased conductivity can produce more accurate testing results.

Figure 9A:
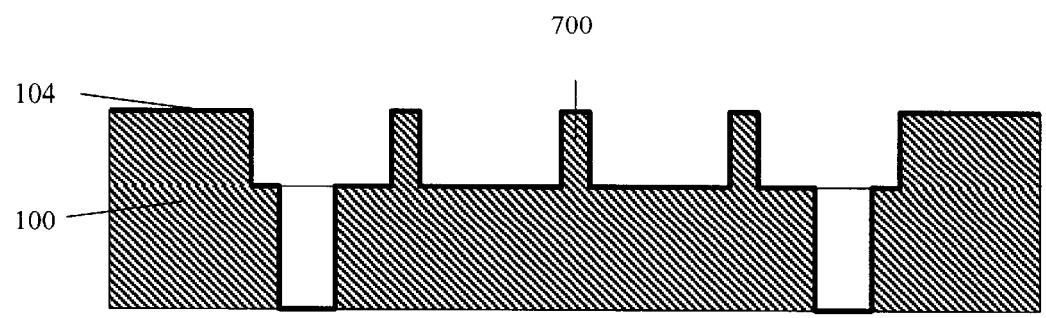
FIGS. 9A and 9B illustrate an exemplary semiconductor device that can be used with various exemplary processes of the present invention.
Figure 9B:
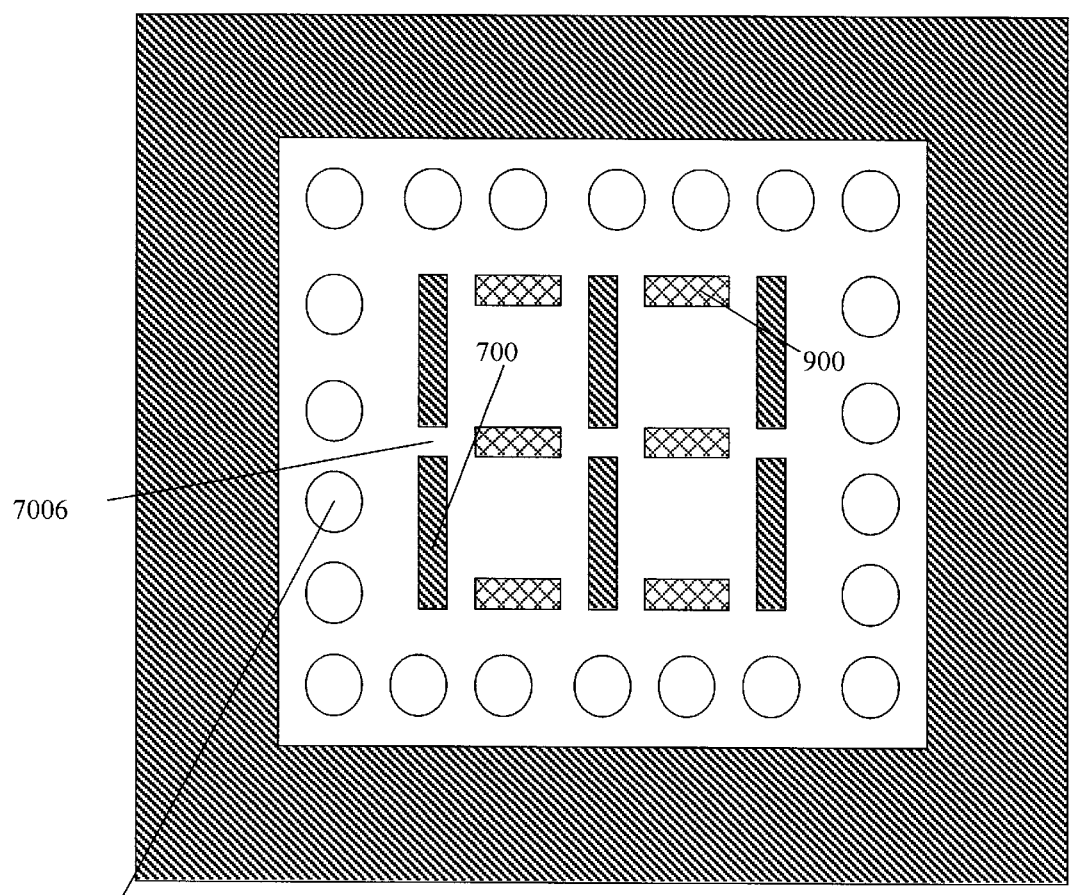

With reference to FIG. 9, another exemplary embodiment of a semiconductor device that can be used with the process shown in FIG. 7 is shown. The exemplary semiconductor device shown in FIG. 9 is similar in many respects to the exemplary semiconductor device shown in FIG. 7B, except that additional dummy structures 900 have been added. These additional dummy structures 900 can increase the planarity of the metal layer 106 deposited on the semiconductor device, and thereby reduce the amount of dishing of the metal layer 106 deposited in large rectangular structure 600. As discussed before, it should be recognized that any number of dummy structures can be included depending on the application. Furthermore, it should be recognized that any configuration of dummy structures can be used depending on the application.

Figure 10A:
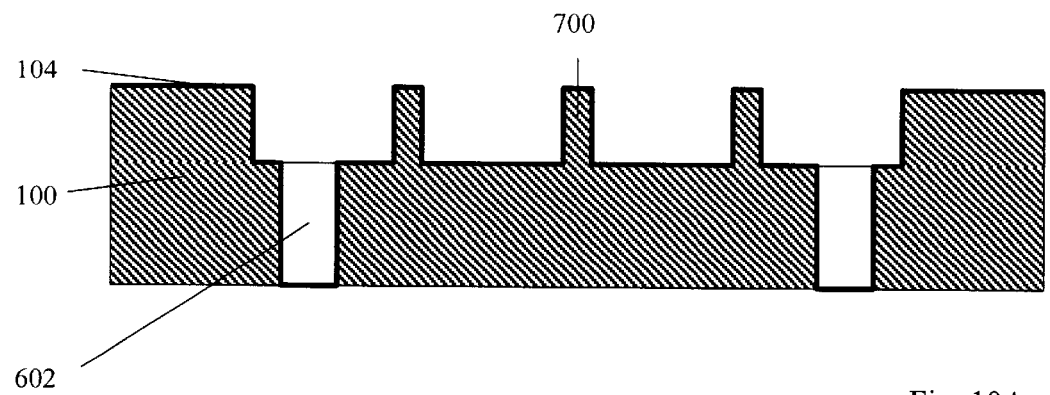
FIGS. 10A and 10B illustrate another exemplary semiconductor device that can be used with various exemplary processes of the present invention.
Figure 10B:
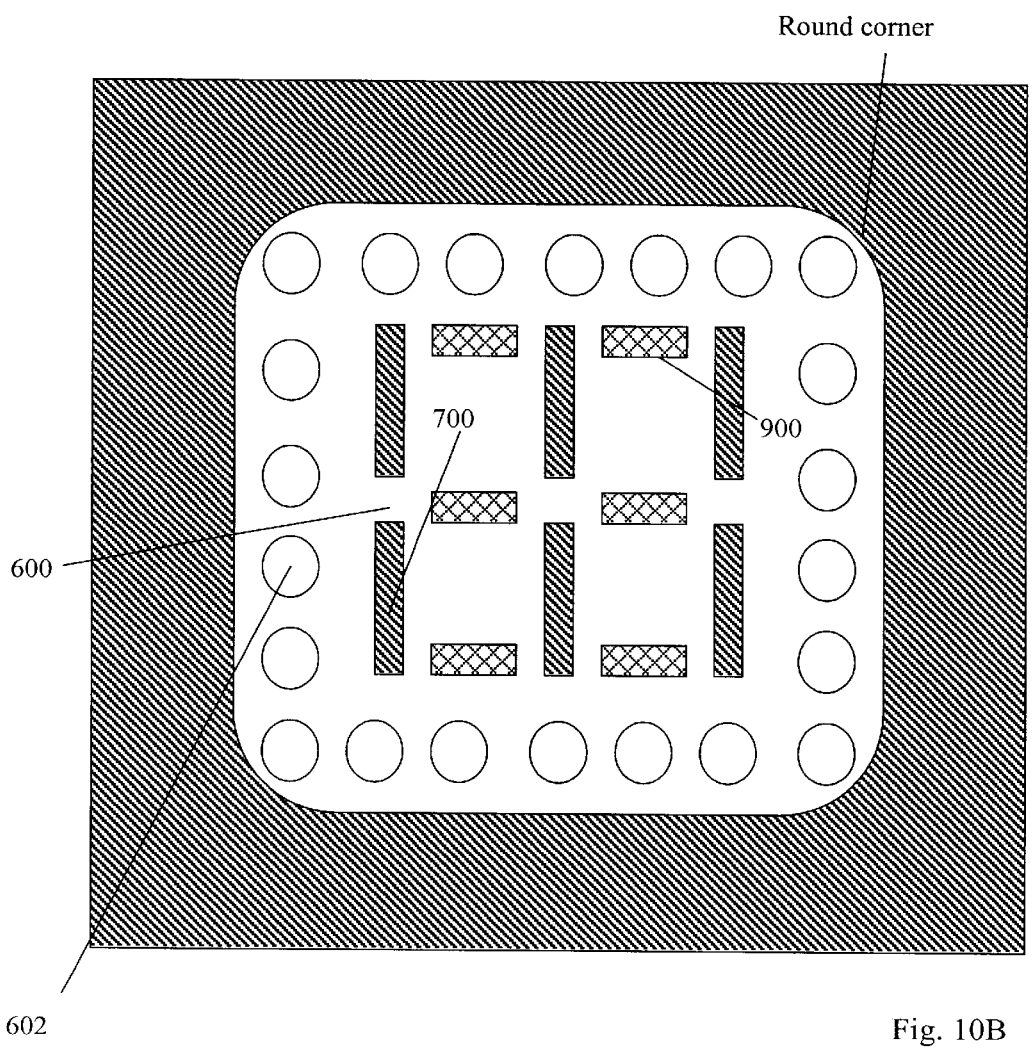

With reference to FIG. 10, another exemplary embodiment of a semiconductor device that can be used with the process shown in FIG. 7 is shown. The exemplary semiconductor device shown in FIG. 10 is similar in many respects to the exemplary semiconductor device shown in FIG. 9B, except that large rectangular structure 600 has rounded corners. These rounded corners can reduce stress in the semiconductor device.

Figure 11A:
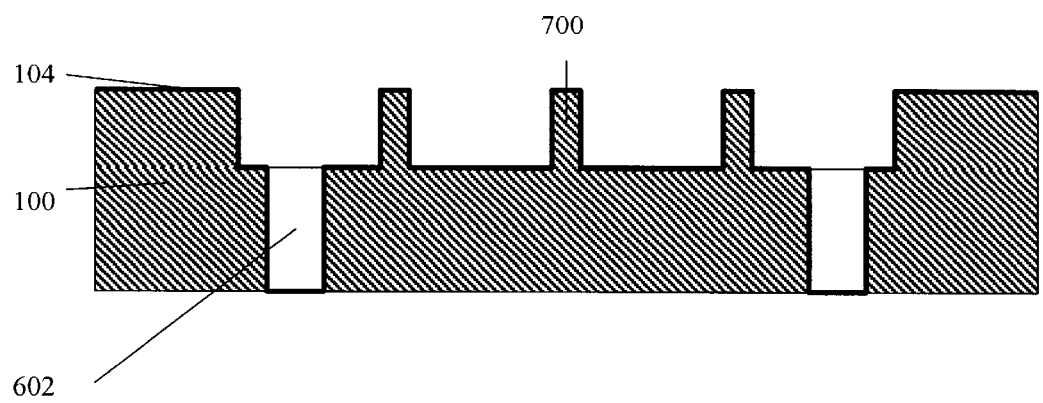
FIGS. 11A and 11B illustrate another exemplary semiconductor device that can be used with various exemplary processes of the present invention.
Figure 11B:
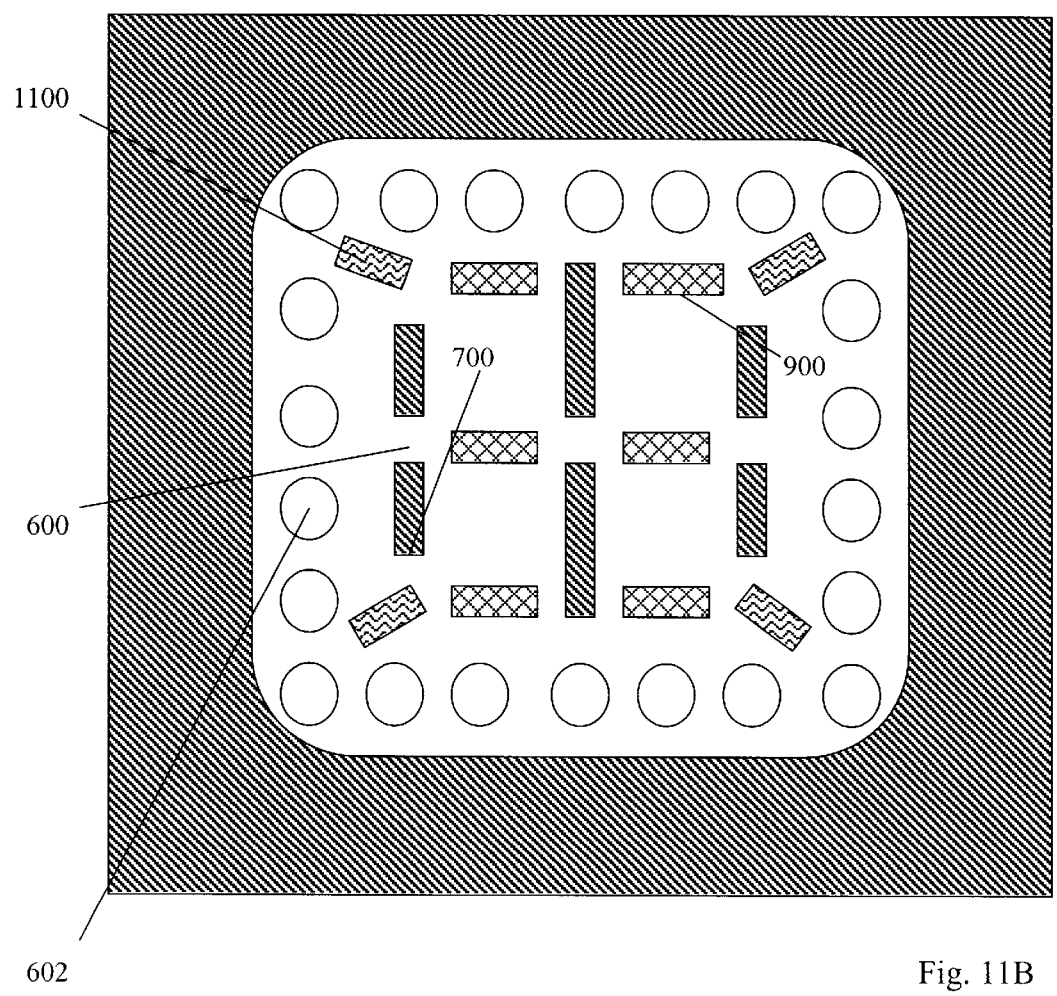

With reference to FIG. 11, another exemplary embodiment of a semiconductor device that can be used with the process shown in FIG. 7 is shown. The exemplary semiconductor device shown in FIG. 11 is similar in many respects to the exemplary semiconductor device shown in FIG. 10, except that additional dummy structures 1100 have been added. These additional dummy structures 1100 can increase the planarity of the metal layer 106 deposited on the semiconductor device, and thereby reduce the amount of dishing of the metal layer 106 deposited in large rectangular structure 600. As discussed before, it should be recognized that any number of dummy structures can be included depending on the application. Furthermore, it should be recognized that any configuration of dummy structures can be used depending on the application.

Figure 12A:
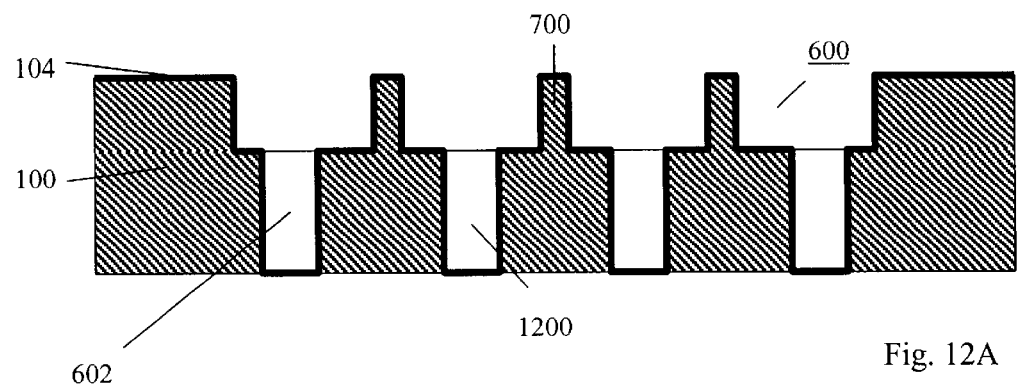
FIGS. 12A and 12B illustrates another exemplary semiconductor device that can be used with various exemplary processes of the present invention.
Figure 12B:
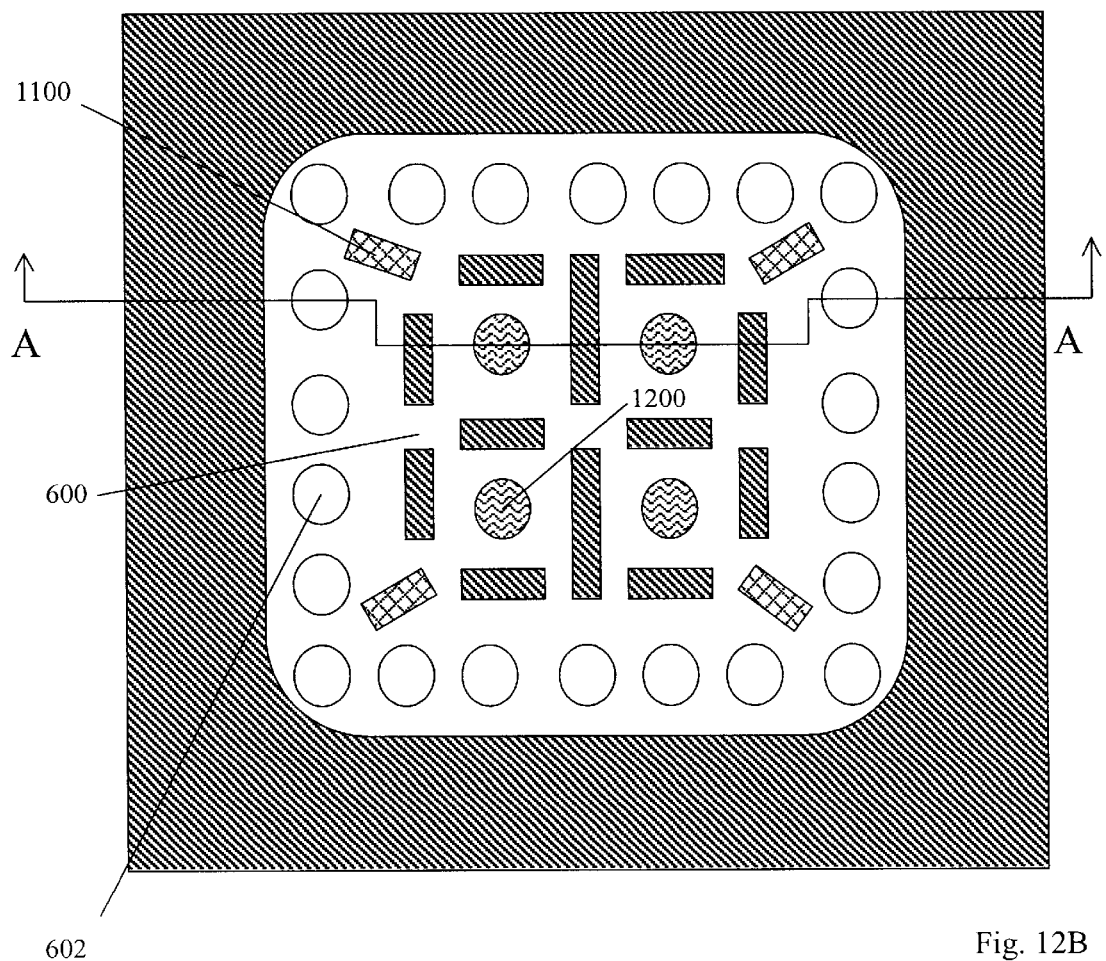

With reference to FIG. 12, another exemplary embodiment of a semiconductor device that can be used with the process shown in FIG. 7 is shown. The exemplary semiconductor device shown in FIG. 12 is similar in many respects to the exemplary semiconductor device shown in FIG. 11B, except that additional vias 1200 have been added. When filled with metal layer 106, these additional vias 1200 can form plugs. These plugs can increase the conductivity between adjacent pads, and can enhance the mechanical strength of the bond pad in the semiconductor device. Enhancing the mechanical strength of the bond pad is particularly advantageous during bonding process when dielectrics having low dielectric constants, and consequently, lower mechanical strength, are used in the semiconductor device. Some examples of materials having a low dielectric constant include hydrogen-silsesquioxane (HSQ), Xerogel, polymer, aerogel, and the like. A material having a lower dielectric constant can be used to increase the speed of signals passing through interconnections formed within the material, and can be used to reduce the power consumption needed to send signals through the interconnections. For instance, $SiO_2$ has a dielectric constant of about 4.0, HSQ has a lower dielectric constant of about 3.0 to 2.5, and Xerogel has an even lower dielectric constant of about 2.0.

Figure 13:
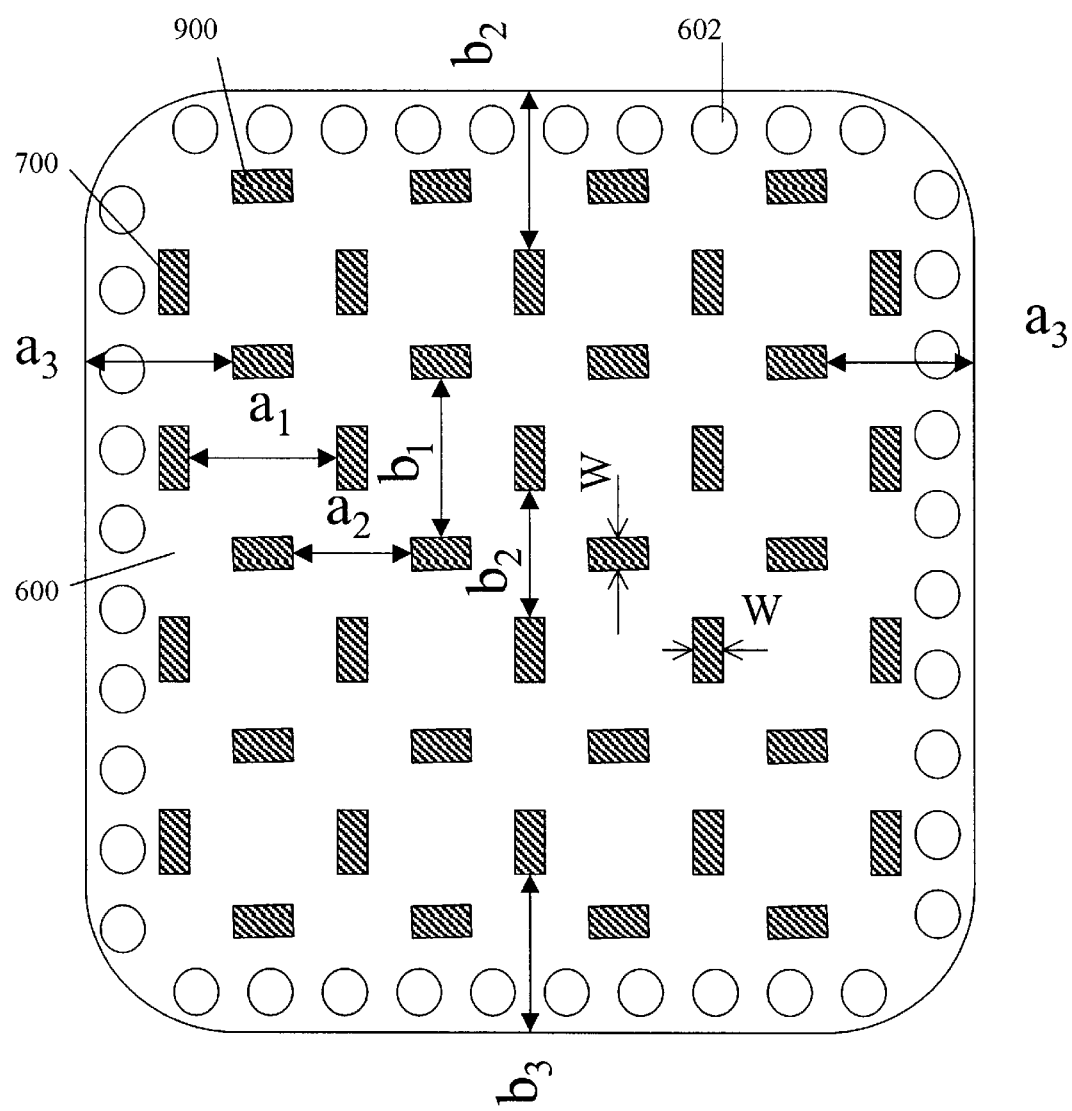
FIG. 13 illustrates an exemplary layout of a large rectangular structure.

With reference to FIG. 13, an exemplary layout of a large rectangular structure that can be used with the process depicted in FIG. 7 is shown. In particular, large rectangular structure 600 can include dummy structures 900 and 700. Dummy structures 700 can be placed apart at distances $a_1$, and $b_2$ from each other, and dummy structures 900 can be placed at distances $a_2$ and $b_1$, from each other. Furthermore, dummy structures 700 can be placed at a distance $b_3$ from the edge of large rectangular structure 600 and dummy structures 900 can be placed at a distance $a_3$ from the edge of large rectangular structure 600.

In the present exemplary layout, the distance between dummy structures 700 and 900 can affect the planarity of metal layer 106 deposited with a thickness T on the non-recessed area 103 of the semiconductor device according to the process depicted in FIG. 7. In particular, the planarity of metal layer 106 deposited on the semiconductor device can be increased by choosing the distances between dummy structures, such that the ratio of the distance between dummy structures to thickness, $a_1/T$, $a_b/T$, $a_1/T$, $b_2/T$, and the ratio of the distance between a dummy structure and the edge of large rectangular structure 600 to thickness, $a_3/T$ and $b_3/T$, is in the range of about 1 to about 5, and preferably less than about 2. However, it should be recognized that other ratios outside of this range can be chosen depending on the particular application.

Although the distance between dummy structures can affect the planarity of the metal layer deposited in a large rectangular structure, the width W of dummy structures 700 and 900 typically does not affect the planarity of the metal layer deposited. However, W can affect the effective cross-sectional area of the pad formed by the metal layer deposited in large rectangular structure 600. Accordingly, W can be reduced in order to increase the effective cross-sectional area of the pad. In particular, the ratio of the width W of the dummy structures 700 and 900 to the thickness T of the metal layer deposited on non-recessed area 103 (W/T) can be chosen in the range of about 0.1 to about 1, and preferably about 0.3. It should be recognized, however, that this ratio can fall outside of this range depending on the particular application.

Figure 14:
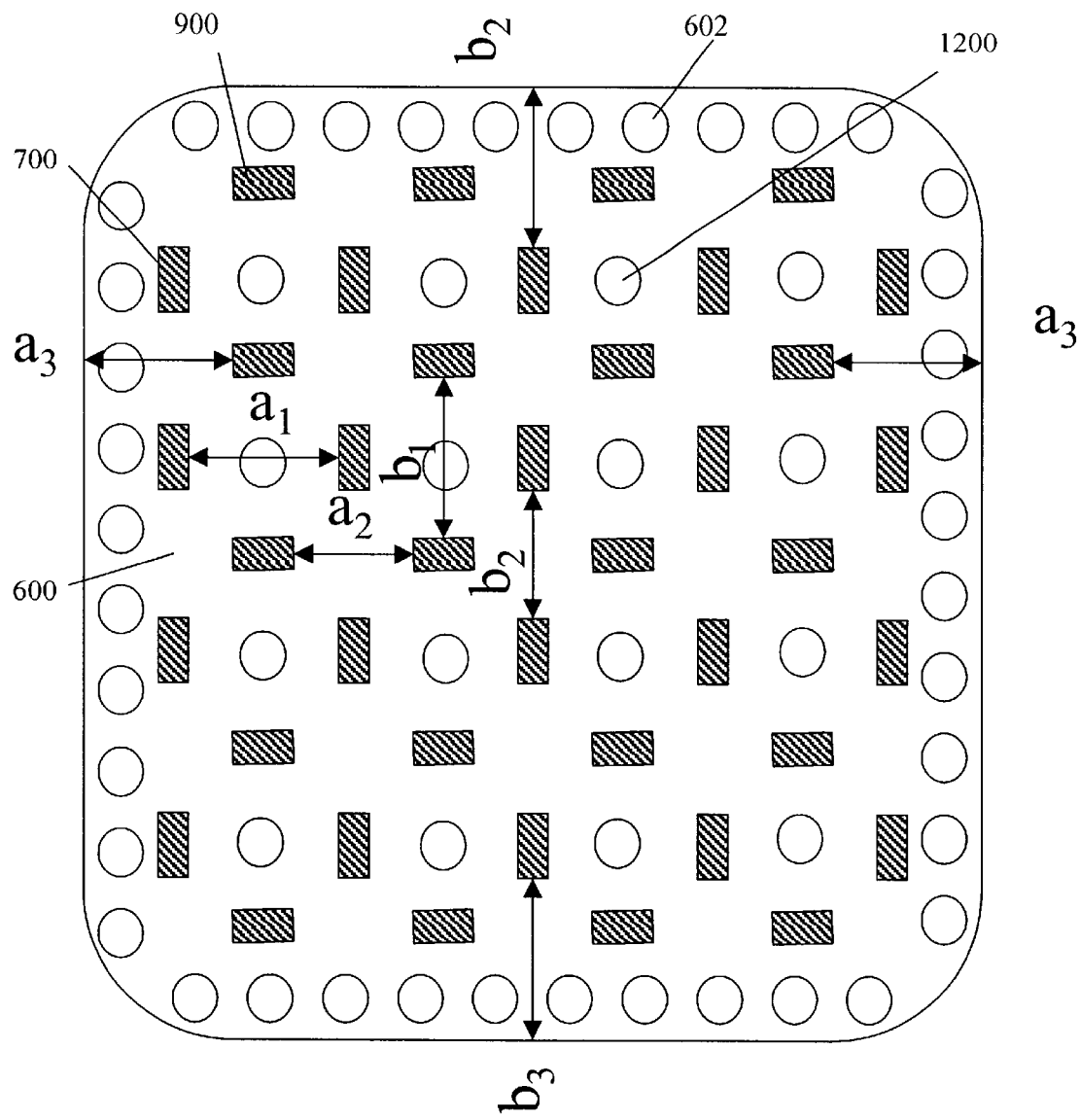
FIG. 14 illustrates another exemplary layout of a large rectangular structure.

With reference to FIG. 14, another exemplary layout of a large rectangular structure that can be used with the process depicted in FIG. 7 is shown. The exemplary layout in FIG. 14 is similar in many respects to the exemplary layout shown in FIG. 13, except that that additional vias 1200 have been added. As described above, when filled with metal layer 106, these additional vias 1200 can form plugs that can increase the conductivity between adjacent pads, and can enhance the mechanical strength of the bond pad in the semiconductor device. As also described above, enhancing the mechanical strength of the bond pad is particularly advantageous during bonding process when dielectrics having low dielectric constants, and consequently, lower mechanical strength, are used in the semiconductor device.

Figure 15:
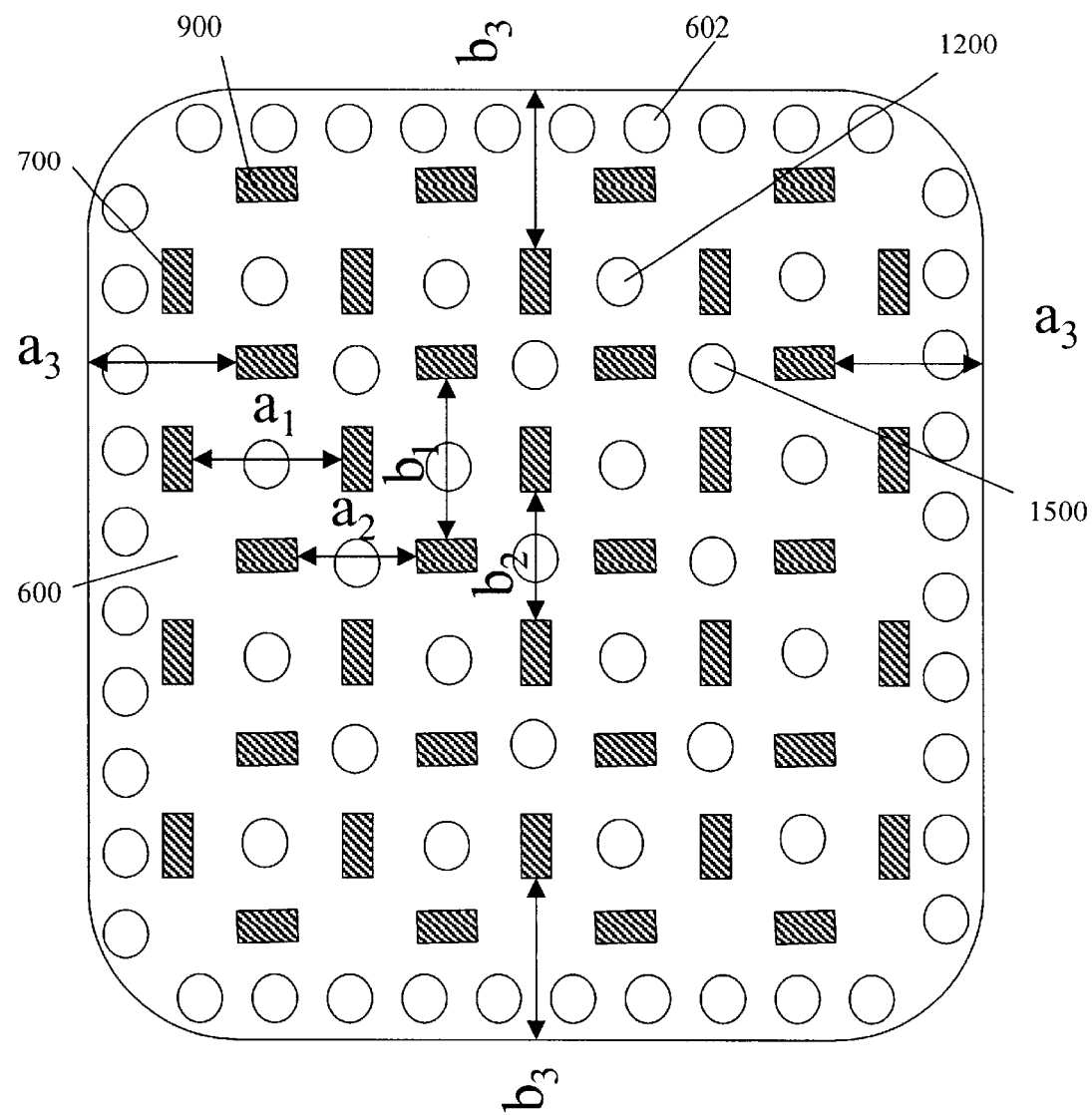
FIG. 15 illustrates another exemplary layout of a large rectangular structure.

With reference to FIG. 15, another exemplary layout of a large rectangular structure that can be used with the process depicted in FIG. 7 is shown. The exemplary layout in FIG. 15 is similar in many respects to the exemplary layout shown in FIG. 14, except that additional vias 1500 have been added. As generally described above, when filled with metal layer 106, these additional vias 1500 can form plugs that can increase the conductivity between adjacent pads, and can enhance the mechanical strength of the bond pad in the semiconductor device. As also described above, enhancing the mechanical strength of the bond pad is particularly advantageous during ponding process when dielectrics having low dielectric constants, and consequently, lower mechanical strength, are used in the semiconductor device.

Figure 16:
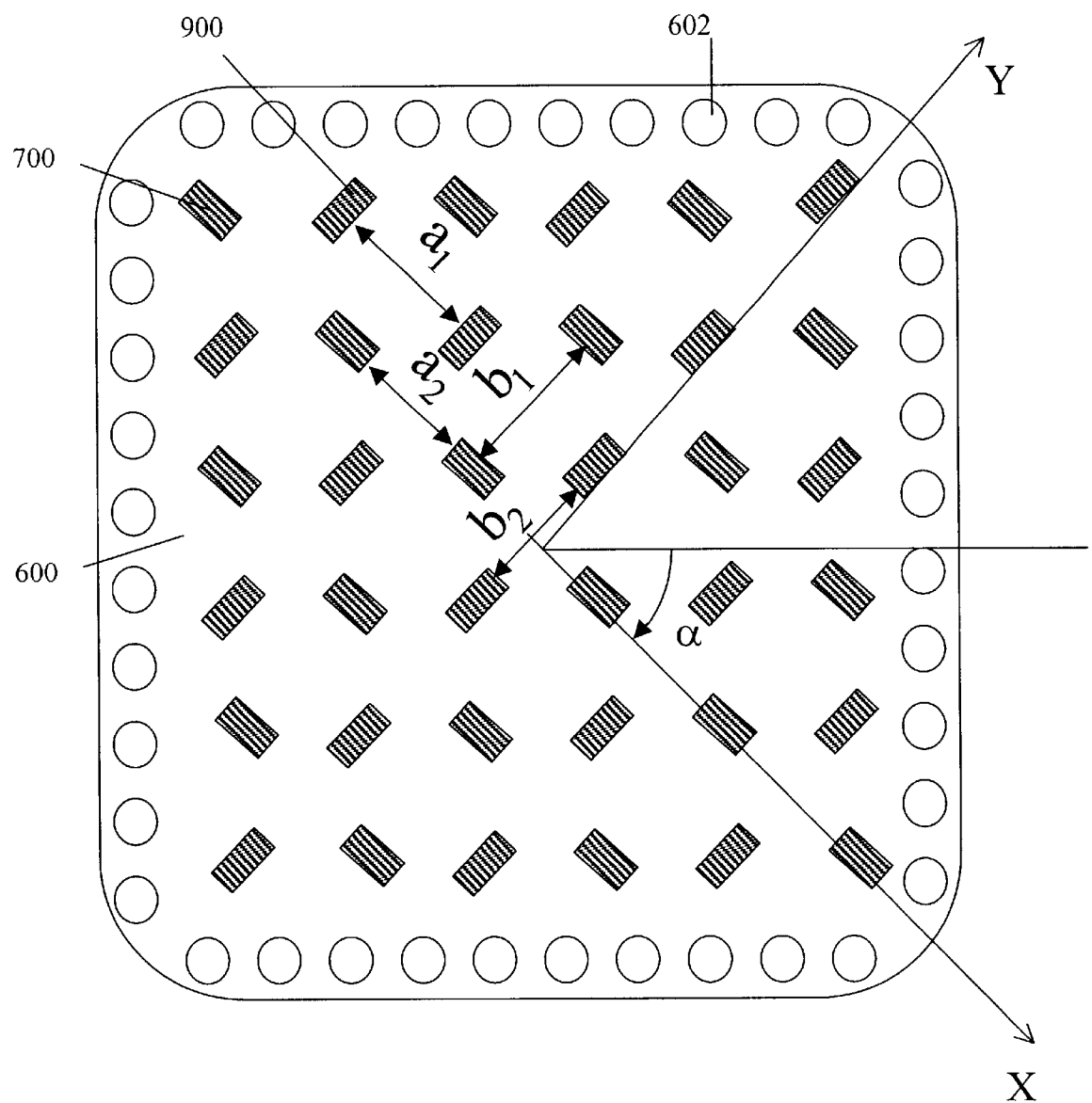
FIG. 16 illustrates another exemplary layout of a large rectangular structure.

With reference to FIG. 16, yet another exemplary layout of a large rectangular structure that can be used with the process depicted in FIG. 7 is shown. The exemplary layout in FIG. 16 is similar in many respects to the exemplary layout depicted in FIG. 13, except that the entire pattern of dummy structures 700 and 900 has been rotated an angle α, where α can be chosen at any angle, such as between 0° and 360°.

With reference to FIGS. 17A–17AA, various exemplary shapes that can be used to form dummy structures are shown. In particular, shapes such as a rectangle, circle, ellipse, triangle, trapezoid, octagon, hexagon, pentagon, and the like can be used. It should be recognized that although particular exemplary shapes are depicted in FIGS. 17A–17AA, any shape can be used to form dummy structures depending on the particular application. Dummy structures can be formed from various materials such as silicon dioxide, and the like, materials having dielectric constants lower than silicon dioxide, such as fluorinated silicate glass, polyimides, fluorinated polyimides, hybrid/composites, siloxanes, organic polymers, [alpha]—C:F, Si—O—C, parylenes/fluorinated parylenes, polyterafluoroethylene, nanoporous silica, nanoporous organic, and the like, and metals such as copper, aluminum, nickel, chromium, zinc, cadmium, silver, gold, rhodium, palladium, platinum, tin, lead, iron, indium, and the like. As described above, in some applications, dummy structures can be formed of the same material as the dielectric used.

As shown in FIG. 18, a problem can arise when using dummy structures according to the processes described above. The process shown in FIG. 18 is similar to the process depicted in FIG. 3, except that barrier layer 104 can become over-removed when a portion of non-recessed area 103 is removed. In particular, with reference to FIGS. 18C and 18D, after metal layer 106 is overpolished from recessed area 102, a portion of non-recessed area 103 that is uneven with metal layer 106 can be removed. Specifically, the exposed portions of barrier layer 104 can be removed by etching, CMP, or any other convenient process.

Figure 18A:
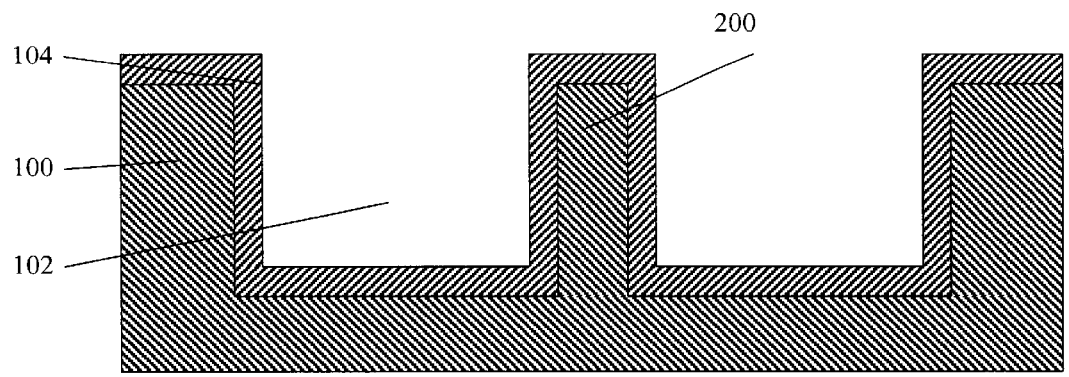
Figure 18B:
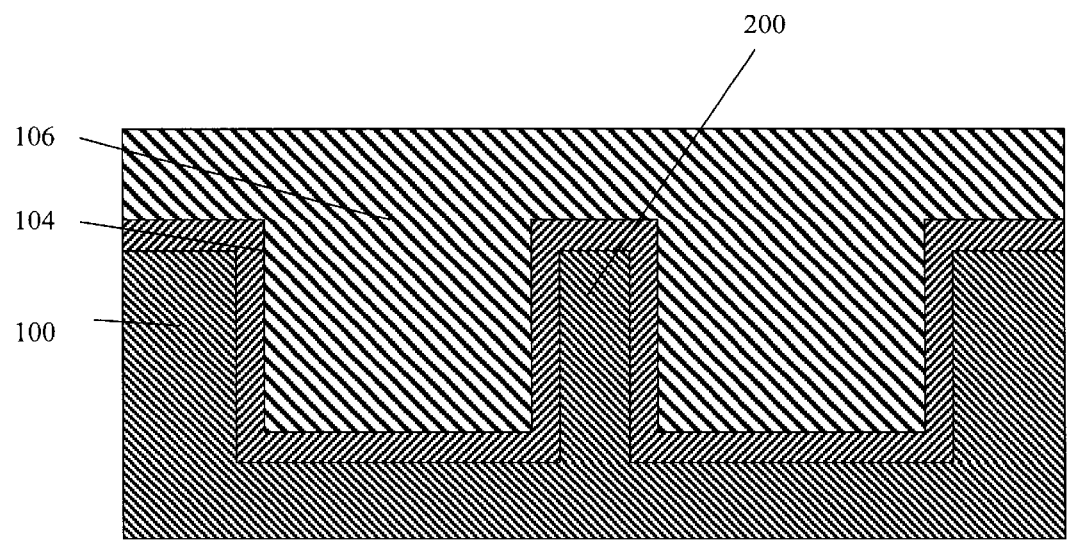
Figure 18C:
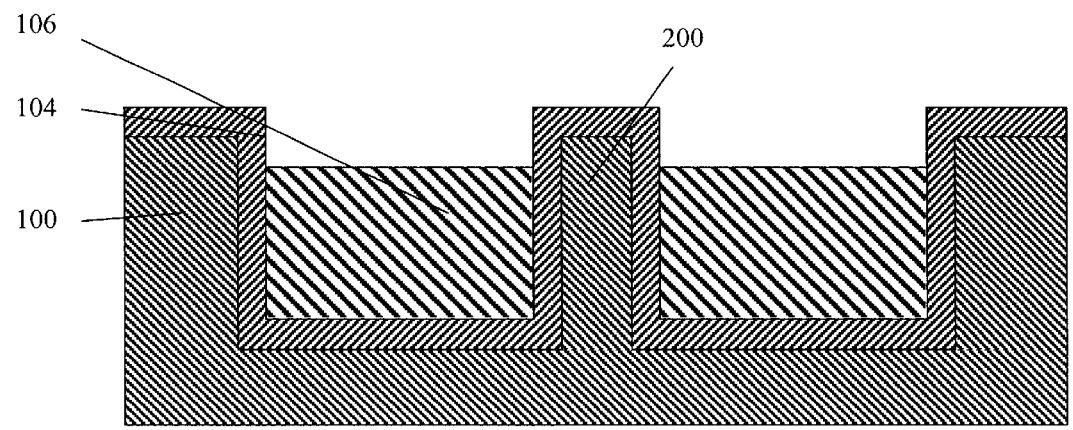
Figure 18D:
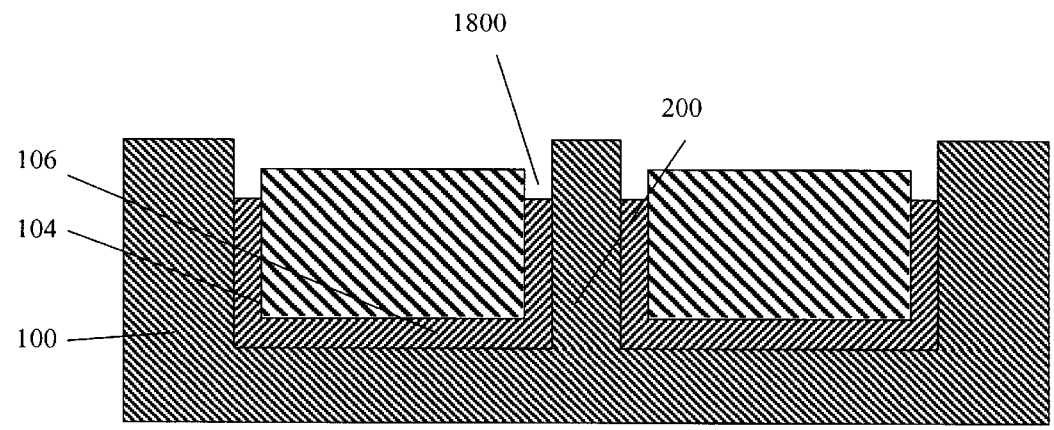
Figure 18E:
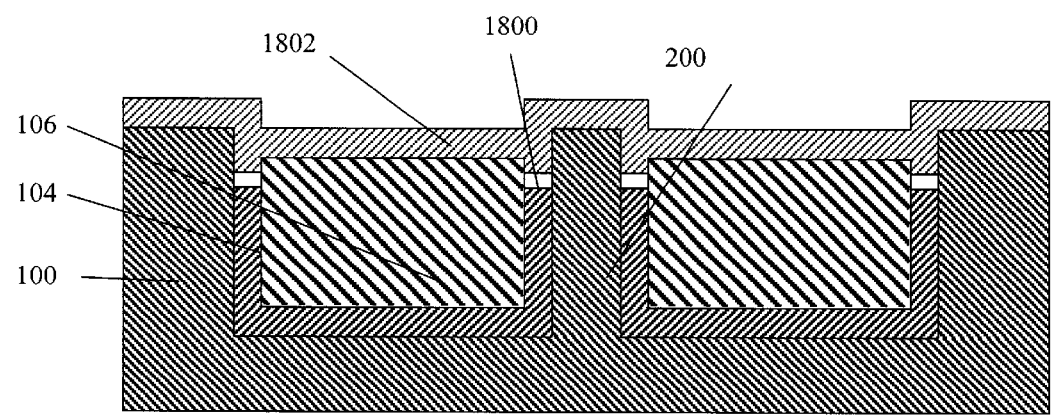

With reference to FIG. 18E, after the exposed portions of barrier layer 104 are removed, a cover layer or passivation layer 1802 can be deposited on the semiconductor device. The cover layer or passivation layer 1802 can include an insulating material, such as SiN, diamond, and the like. However, if barrier layer 104 is over-removed in the previous step, a gap 1800 can form between metal layer 106 and dielectric 100, especially if cover layer 1802 does not fill the space caused by the over-removal of barrier layer 104. Gap 1800 can allow metal layer 106 to diffuse into dielectric 100 when particular metals and dielectric materials are used, such as when metal layer 106 is formed from copper and dielectric 100 is a material having a low dielectric constant. Such diffusion of metal layer 106 into dielectric 100 can cause reliability problems in the semiconductor device.

Accordingly, FIGS. 19–27 depict various embodiments of solutions to the problem presented in FIG. 18. In some of these exemplary embodiments, non-recessed area 103 can be removed such that barrier layer 104 is at the same or similar level as dielectric 100. In other of these exemplary embodiments, non-recessed area 103 can be removed such that barrier layer 104 protrudes beyond the surface of dielectric 100.

FIG. 19 shows an exemplary process of removing non-recessed area 103, such that barrier layer 104, metal layer 106, and dielectric 100 each have surfaces at the same or a similar level. In particular, with reference to FIG. 19A, after metal layer 106 is overpolished from recessed area 102 (FIG. 18), barrier layer 104 and dielectric 100 can be removed at the same rate in order to allow barrier layer 104 and dielectric 100 to form surfaces at the same or a similar level. In particular, with reference to FIG. 19B, barrier layer 104 and dielectric 100 can be removed by any convenient method such as wet etching, dry chemical etching, dry plasma etching, CMP, and the like. For example, if plasma etching is used, the plasma etching can include low density plasma (reactive ion etching), high-density plasma (inductive couple plasma (ICP), Helicon plasma (HP), electron cyclotron resonance (ECR)), atmospheric pressure plasma (silent discharge plasma), and the like, and the plasma power can be chosen between about 500 W and about 2000 W, preferably about 1000 W. Furthermore, in the present example, vacuum pressure can be chosen between about 30 mTorr and about 100 mTorr, preferably about 50 mTorr, the temperature of the semiconductor device can be chosen to be about 20° C., and the gas and flow rate of $C_4F_8$, $O_2$, and Ar, if used, can be about 8 sccm, about 2 sccm, and about 100 sccm, respectively. In addition, TaN, which can be used as barrier layer 104, can be removed at a rate of about 150 nm/min, and $SiO_2$, which can be used as dielectric 100, can be removed at a rate of about 150 nm/min.

In the present exemplary embodiment, with reference to FIG. 19C, after a desired portion of barrier layer 104 and dielectric 100 is removed, cover layer 1802 can be deposited on the semiconductor device. As shown, when barrier layer 104, dielectric 100, and metal layer 106 have surfaces at the same or a similar level, gap 1800 (FIG. 18) can be eliminated, and the diffusion of metal layer 106 into dielectric 100 can be reduced.

FIG. 20 shows an exemplary process of removing non-recessed area 103, such that barrier layer 104 protrudes beyond the surface of metal layer 106 and dielectric 100. In particular, with reference to FIG. 20A, after metal layer 106 is overpolished from recessed area 102 (FIG. 18), barrier layer 104 can be removed at a lower rate than dielectric 100 in order to allow barrier layer 104 to protrude beyond the surface of dielectric 100 and metal layer 106. In particular, barrier layer 104 and dielectric 100 can be removed by any convenient method such as wet etching, dry chemical etching, dry plasma etching, CMP, and the like. For example, if plasma etching is used, the plasma power can be chosen between about 500 W and about 2000 W, preferably about 1000 W. Furthermore, in the present example, vacuum pressure can be chosen between about 50 mTorr and about 120 mTorr, preferably about 90 mTorr, the temperature of the semiconductor device can be chosen to be about 20° C., and the gas and flow rate of $C_4F_8$, $O_2$, and Ar, if used, can be about 8.5 sccm, about 6.7 sccm, and about 115 sccm, respectively. In addition, barrier layer 104 can be removed at a rate of about 70 nm/min if TaN is used, and at a rate of about 90 nm/min if TiN is used. Furthermore, $SiO_2$, which can be used as dielectric 100, can be removed at a rate of about 300 nm/min.

In the present exemplary embodiment, with reference to FIG. 20C, after a desired portion of barrier layer 104 and dielectric 100 is removed, cover layer 1802 can be deposited on the semiconductor device. As shown, when barrier layer 104 protrudes beyond the surface of dielectric 100 and metal layer 106, gap 1800 (FIG. 18) can be eliminated, and diffusion of metal layer 106 into dielectric 100 can be reduced. In addition, allowing barrier layer 104 to protrude in this manner can better prevent diffusion than forming barrier layer 104 at the same or a similar level as dielectric 100 and metal layer 106. However, some planarity of cover layer 1802 can be lost when barrier layer 104 protrudes in this manner. As described, this loss of planarity can cause problems when forming subsequent layers of the semiconductor device. However, depending on the application, this loss of planarity can be acceptable.

FIG. 21 shows another exemplary process of removing non-recessed area 103, such that barrier layer 104 protrudes beyond the surface of metal layer 106 and dielectric 100. In particular, with reference to FIG. 21A, after metal layer 106 is overpolished from recessed area 102 (FIG. 18), barrier layer 104 and dielectric 100 can be removed in two steps. With reference to FIG. 21B, in the first step, barrier layer 104 and dielectric 100 can be removed at the same rate. With reference to FIG. 21C, in the second step, dielectric 100 can be removed at a higher rate than barrier layer 104 in order to allow barrier layer 104 to protrude beyond the level of dielectric 100 and metal layer 106. In some applications, removal of barrier layer 104 can be halted in the second step, such that the rate is zero. Furthermore, barrier layer 104 and dielectric 100 can be removed by any convenient method such as wet etching, dry chemical etching, dry plasma etching, CMP, and the like. For example, in the first step, plasma etching can be used, and the plasma power can be chosen between about 500 W and about 2000 W, preferably about 1000 W. Furthermore, in the present example, vacuum pressure can be chosen between about 30 mTorr and about 100 mTorr, preferably about 50 mTorr, the temperature of the semiconductor device can be chosen to be about 20° C., and the gas and flow rate of $C_4F_8$, $O_2$, and Ar, if used, can be about 8 sccm, about 2 sccm, and about 100 sccm, respectively. In addition, both barrier layer 104, which includes TaN, and dielectric 100, which includes $SiO_2$, can be removed at a rate of about 150 nm/min.

In the second step of the present example, plasma etching can be used, and the plasma power can be chosen between about 500 W and about 2000 W, preferably about 1000 W. Furthermore, in the present example, vacuum pressure can be chosen between about 30 mTorr and about 100 mTorr, preferably about 80 mTorr, the temperature of the semiconductor device can be chosen to be about 20° C., and the gas and flow rate of $SF_6$, if used, can be about 50 sccm. In addition, barrier layer 104 can be removed at a rate of about 250 nm/min if TaN is used, and at a rate of about 300 nm/min if TiN is used. Furthermore, $SiO_2$, which can be used as dielectric 100, can be removed at a rate of about 20 nm/min.

Figure 21A:
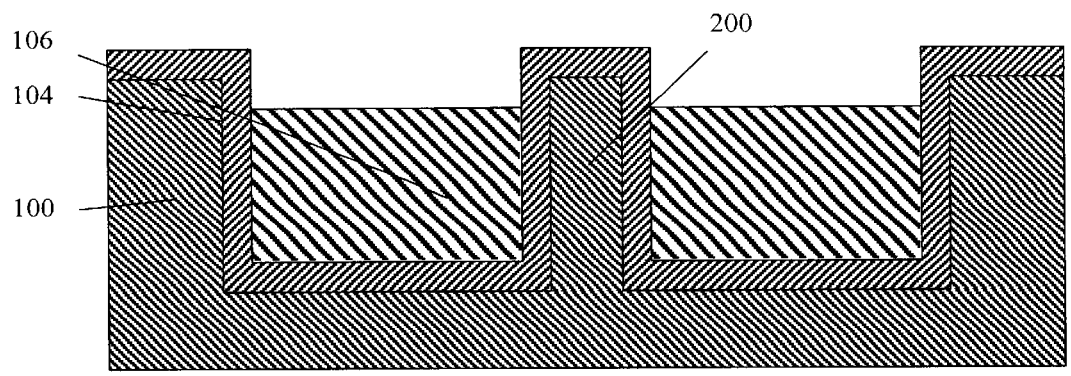
Figure 21B:
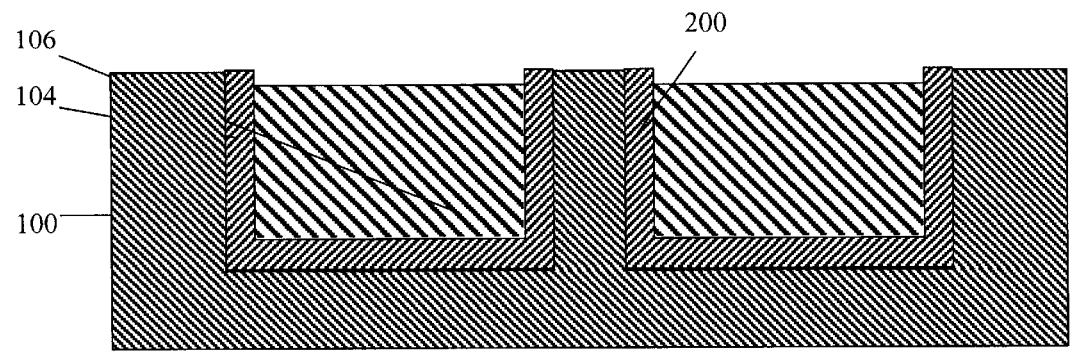
Figure 21C:
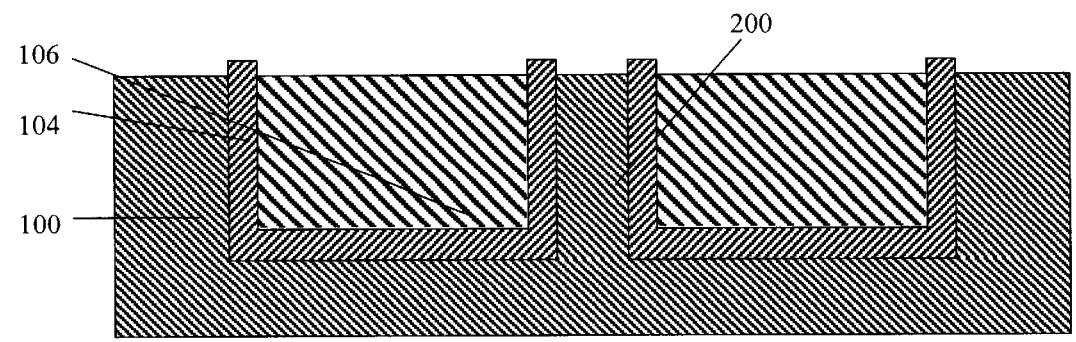
Figure 21D:
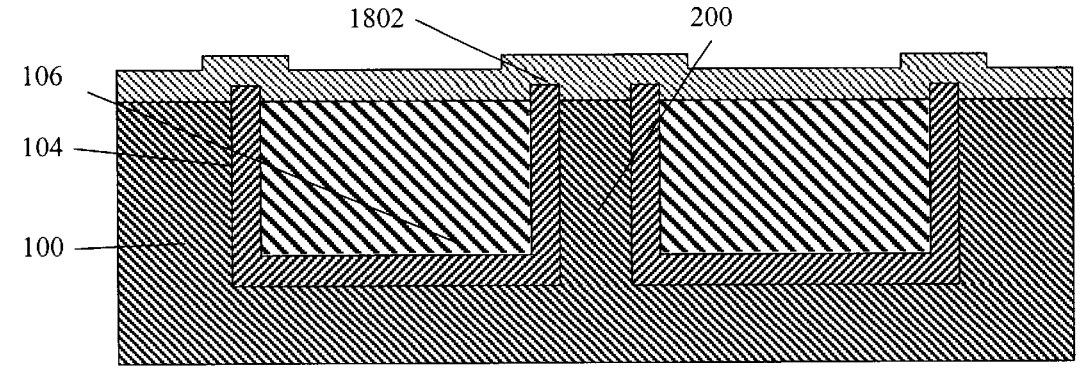

In the present exemplary embodiment, with reference to FIG. 21D, after a desired portion of barrier layer 104 and dielectric 100 is removed, cover layer 1802 can be deposited on the semiconductor device. As shown, when barrier layer 104 protrudes beyond the level of dielectric 100 and metal layer 106, gap 1800 (FIG. 18) can be eliminated, and diffusion of metal layer 106 into dielectric 100 can be reduced. As described above, allowing barrier layer 104 to protrude in this manner can result in some loss of planarity of cover layer 1802. However, depending on the application, this loss of planarity can be acceptable.

FIG. 22 shows yet another exemplary process of removing non-recessed area 103, such that barrier layer 104 protrudes beyond the surface of metal layer 106. In particular, with reference to FIG. 22A, after metal layer 106 is overpolished from recessed area 102 (FIG. 18), barrier layer 104 and dielectric 100 can be removed in two steps. With reference to FIG. 22B, in the first step, barrier layer 104 can be removed at a higher rate than dielectric 100. With reference to FIG. 22C, in the second step, dielectric 100 can be removed at a higher rate while barrier layer 104 can be removed at a rate of zero, in order to allow barrier layer 104 to protrude beyond the surface of dielectric 100 and metal layer 106. In particular, barrier layer 104 and dielectric 100 can be removed by any convenient method such as wet etching, dry chemical etching, dry plasma etching, CMP, and the like.

For example, in the first step, plasma etching can be used, and the plasma power can be chosen between about 500 W and about 2000 W, preferably about 1000 W. Furthermore, in the present example, vacuum pressure can be chosen between about 30 mTorr and about 100 mTorr, preferably about 80 mTorr, the temperature of the semiconductor device can be chosen to be about 20° C., and the gas and flow rate of SF6, if used, can be about 50 sccm. In addition, barrier layer 104 can be removed at a rate of about 250 nm/min if TaN is used, and at a rate of about 300 nm/min if TiN is used. Furthermore, dielectric 100, which includes $SiO_2$, can be removed at a rate of about 20 nm/min. In the second step of the present example, the settings for the first step can be the same, except that removal of barrier layer 104 can be halted and set to a rate of zero.

Figure 22A:
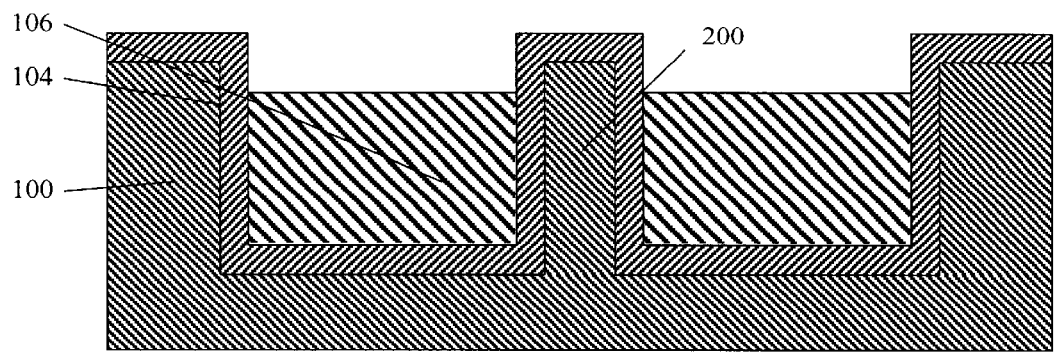
Figure 22B:
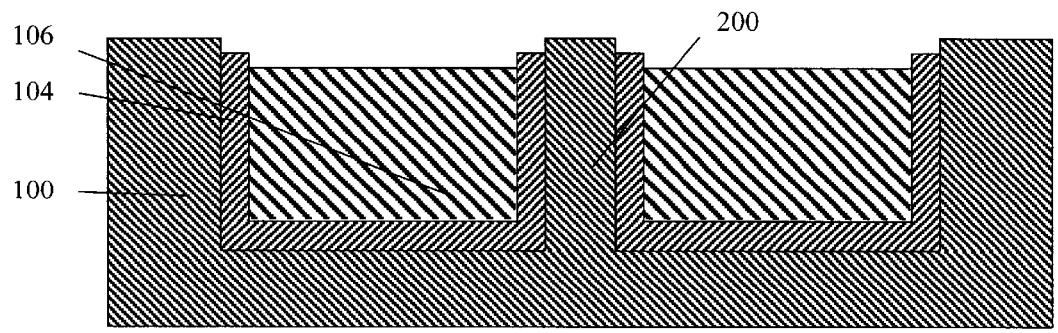
Figure 22C:
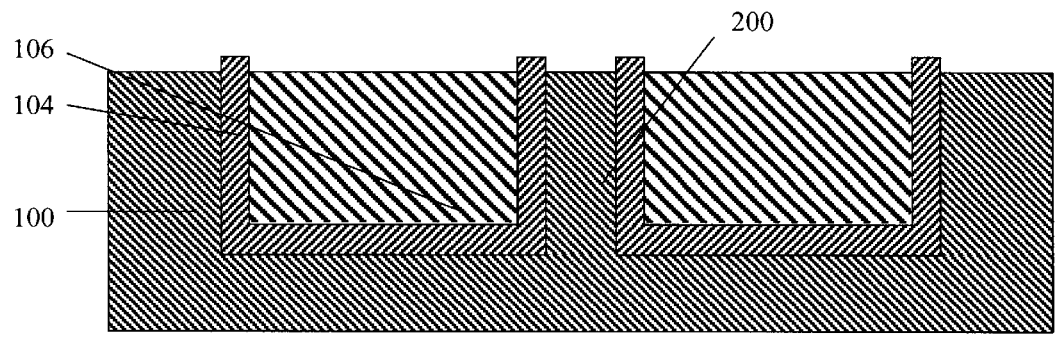
Figure 22D:
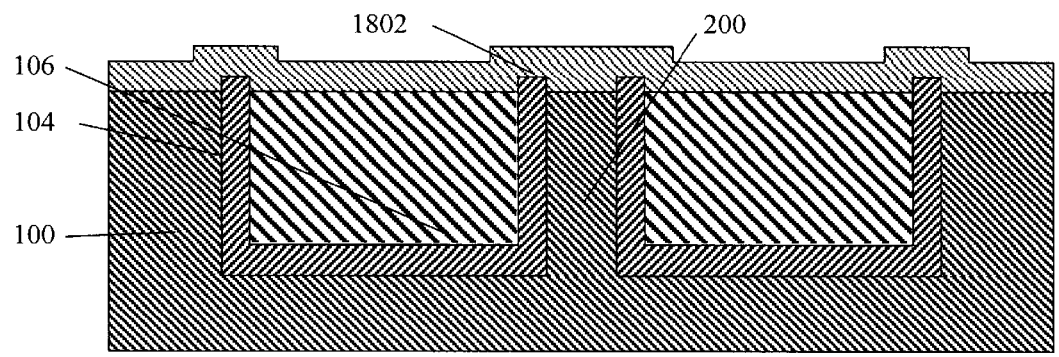

In the present exemplary embodiment, with reference to FIG. 22D, after a desired portion of barrier layer 104 and dielectric 100 is removed, cover layer 1802 can be deposited on the semiconductor device. As shown, when barrier layer 104 protrudes beyond the surface of dielectric 100 and metal layer 106, gap 1800 (FIG. 18) can be eliminated, and diffusion of metal layer 106 into dielectric 100 can be reduced. As described above, allowing barrier layer 104 to protrude in this manner can result in some loss of planarity of cover layer 1802. However, depending on the application, this loss of planarity can be acceptable.

FIG. 23 shows another exemplary process of removing non-recessed area 103, such that barrier layer 104, metal layer 106, and dielectric 100 each have surfaces at the same or a similar level. In particular, with reference to FIG. 23A, after metal layer 106 is overpolished from recessed area 102 (FIG. 18), barrier layer 104 and dielectric 100 can be removed in two steps. With reference to FIG. 23B, in the first step, barrier layer 104 can be removed at a higher rate than dielectric 100. With reference to FIG. 23C, in the second step, dielectric 100 can be removed at a higher rate than barrier layer 104, in order allow barrier layer 104 and dielectric 100 to form surfaces at the same or a similar level. In particular, barrier layer 104 and dielectric 100 can be removed by any convenient method such as wet etching, dry chemical etching, dry plasma etching, CMP, and the like.

For example, in the first step, plasma etching can be used, and the plasma power can be chosen between about 500 W and about 2000 W, preferably about 1000 W. Furthermore, in the present example, vacuum pressure can be chosen between about 30 mTorr and about 100 mTorr, preferably about 80 mTorr, the temperature of the semiconductor device can be chosen to be about 20° C., and the gas and flow rate of $SF_6$, if used, can be about 50 sccm. In addition, barrier layer 104 can be removed at a rate of about 250 nm/min if TaN is used, and at a rate of about 300 nm/min if TiN is used. Furthermore, dielectric 100, which includes $SiO_2$, can be removed at a rate of about 20 nm/min.

In the second step of the present example, plasma etching can be used, and the plasma power can be chosen between about 500 W and about 2000 W, preferably about 1000 W. Furthermore, in the present example, vacuum pressure can be chosen between about 50 mTorr and about 120 mTorr, preferably about 90 mTorr, the temperature of the semiconductor device can be chosen to be about 20° C., and the gas and flow rate of $C_4F_8$, $O_2$, and Ar, if used, can be about 8.5 sccm, about 6.7 sccm, and about 115 sccm, respectively. In addition, barrier layer 104 can be removed at a rate of about 70 nm/min if TaN is used, and at a rate of about 90 nm/min if TiN is used. Furthermore, dielectric 100, which includes $SiO_2$, can be removed at a rate of about 300 nm/min.

Figure 23A:
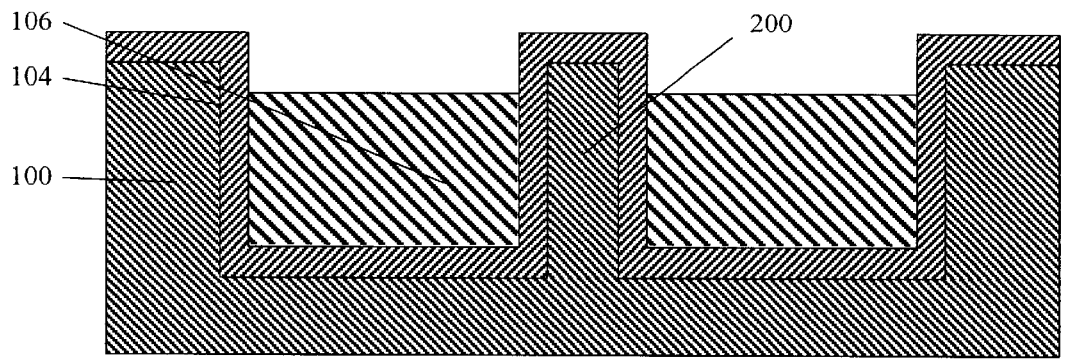
Figure 23B:
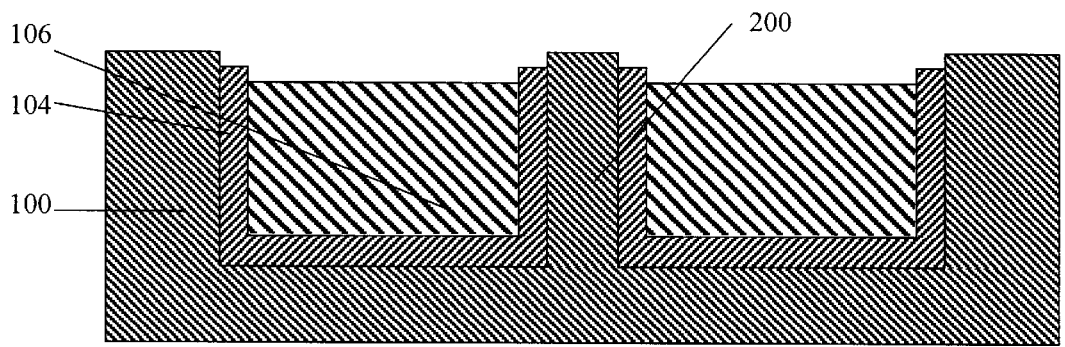
Figure 23C:
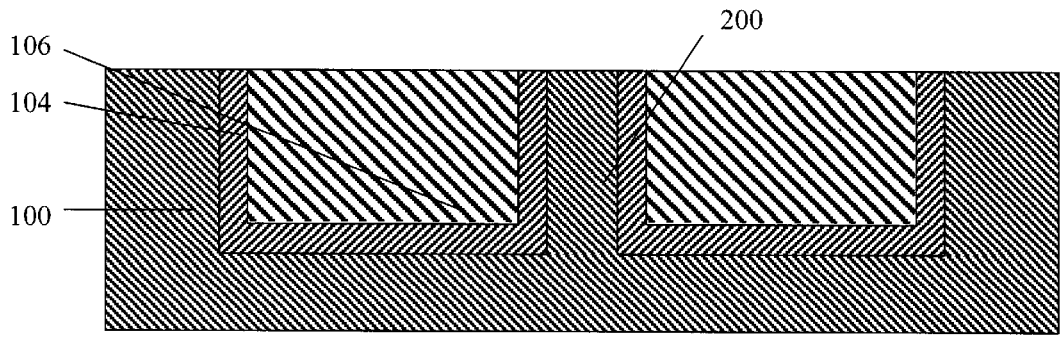
Figure 23D:
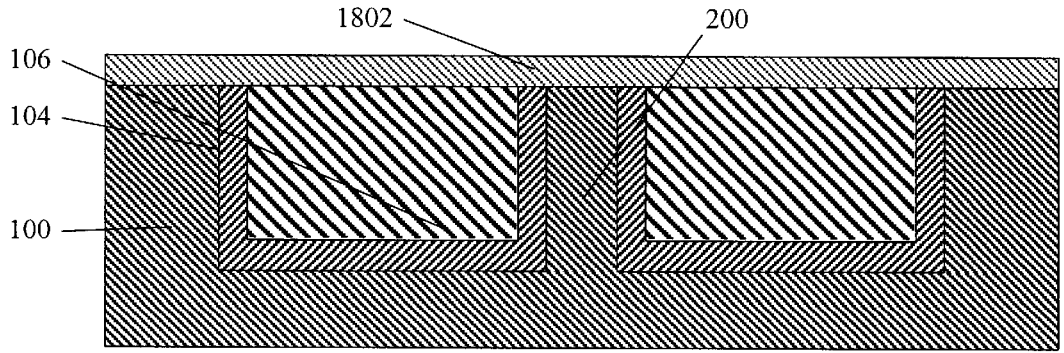

In the present exemplary embodiment, with reference to FIG. 23D, after a desired portion of barrier layer 104 and dielectric 100 is removed, cover layer 1802 can be deposited on the semiconductor device. As shown, when barrier layer 104, dielectric 100, and metal layer 106 have surfaces at the same or a similar level, gap 1800 (FIG. 18) can be eliminated, and diffusion of metal layer 106 into dielectric 100 can be reduced. Although the planarity of the semiconductor device produced by this exemplary process can be better than semiconductor devices including a barrier layer 104 that protrudes beyond dielectric 100 and metal layer 106, the semiconductor device produced by the present exemplary process poses an increased risk that metal layer 106 can diffuse into dielectric 100, as compared to semiconductor devices including a barrier layer 104 that protrudes beyond dielectric 100 and metal layer 106.

FIG. 24 shows yet another exemplary process of removing non-recessed area 103, such that barrier layer 104, dielectric 100, and metal layer 106 have surfaces at the same or a similar level. In particular, with reference to FIG. 24A, after metal layer 106 is overpolished from recessed area 102 (FIG. 18), barrier layer 104 and dielectric 100 can be removed in two steps. With reference to FIG. 24B, in the first step, barrier layer 104 can be removed at a higher rate while dielectric 100 can be removed at a rate of zero. With reference to FIG. 24C, in the second step, dielectric 100 can be removed at a higher rate while barrier layer 104 can be removed at a rate of zero, in order to allow barrier layer 104 and dielectric 100 to form surfaces at the same or a similar level. In particular, barrier layer 104 and dielectric 100 can be removed by any convenient method such as wet etching, dry chemical etching, dry plasma etching, CMP, and the like.

Figure 24A:
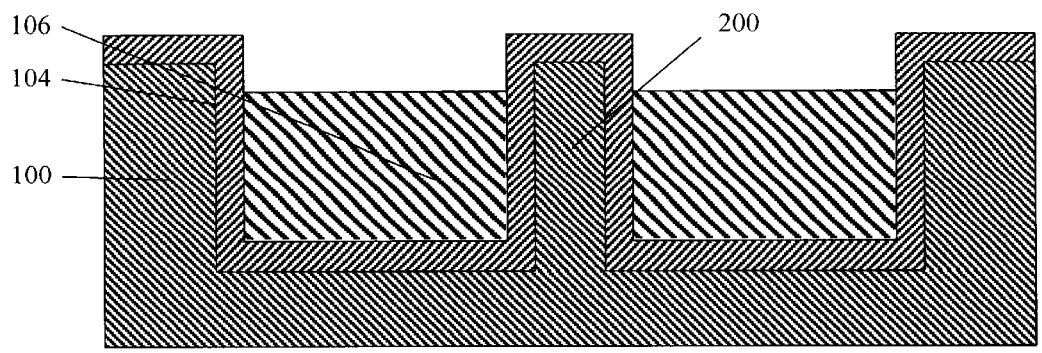
Figure 24B:
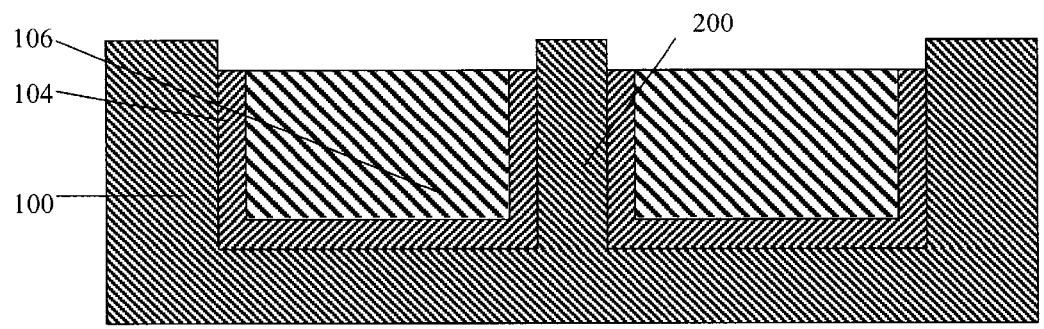
Figure 24C:
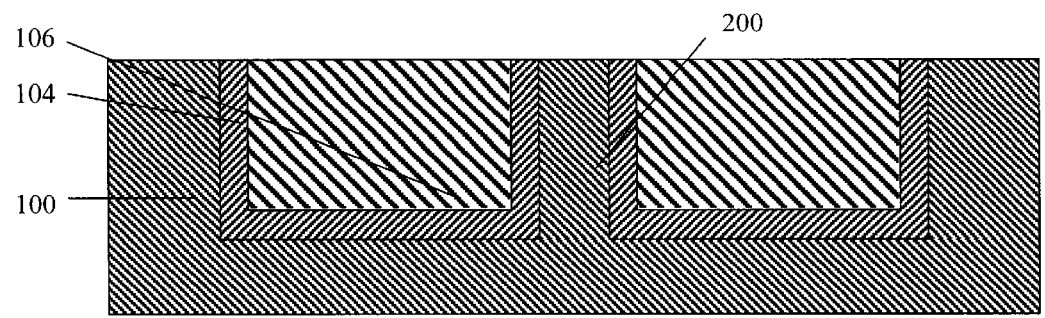
Figure 24D:
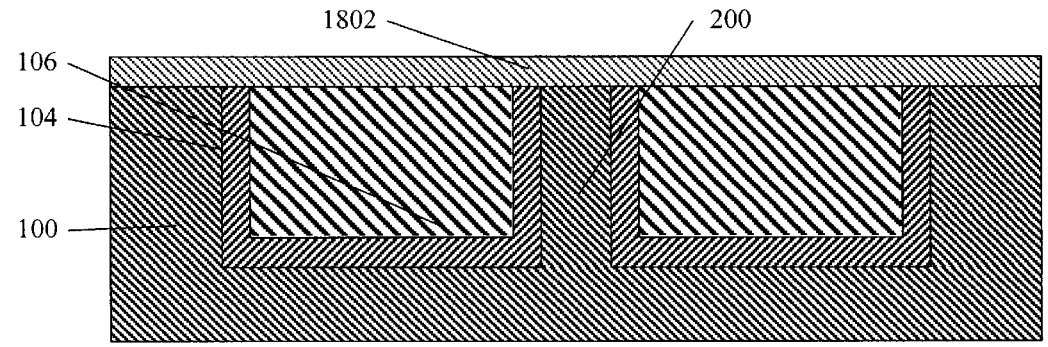

In the present exemplary embodiment, with reference to FIG. 24D, after a desired portion of barrier layer 104 and dielectric 100 is removed, cover layer 1802 can be deposited on the semiconductor device. As shown, when barrier layer 104, dielectric 100 and metal layer 106 have surfaces at the same or a similar level, gap 1800 (FIG. 18) can be eliminated, and diffusion of metal layer 106 into dielectric 100 can be reduced. Although the planarity of the semiconductor device can be better than semiconductor devices including a barrier layer 104 that protrudes beyond dielectric 100 and metal layer 106, the semiconductor device produced by the present exemplary process poses an increased risk that metal layer 106 can diffuse into dielectric 100, as compared to semiconductor devices that include a barrier layer 104 that protrudes beyond dielectric 100 and metal layer 106.

FIG. 25 shows another exemplary process of removing non-recessed area 103, such that barrier layer 104, dielectric 100, and metal layer 106 have surfaces at the same or a similar level. In particular, with reference to FIG. 25A, after metal layer 106 is overpolished from recessed area 102 (FIG. 18), barrier layer 104 and dielectric 100 can be removed in two steps. With reference to FIG. 25B, in the first step, barrier layer 104 can be removed at a lower rate than dielectric 100. With reference to FIG. 25C, in the second step, barrier layer 104 can be removed at a higher rate while dielectric 100 can be removed at a rate of zero, in order to allow barrier layer 104 and dielectric 100 to form surfaces at the same or a similar level. In particular, barrier layer 104 and dielectric 100 can be removed by any convenient method such as wet etching, dry chemical etching, dry plasma etching, CMP, and the like. For example, in the first step, plasma etching can be used, and the plasma power can be chosen between about 500 W and about 2000 W, preferably about 1000 W. Furthermore, in the present example, vacuum pressure can be chosen between about 50 mTorr and about 120 mTorr, preferably about 90 mTorr, the temperature of the semiconductor device can be chosen to be about 20° C., and the gas and flow rate of $C_4F_8$, $O_2$, and Ar, if used, can be about 8.5 sccm, about 6.7 sccm, and about 115 sccm, respectively. In addition, barrier layer 104 can be removed at a rate of about 70 nm/min if TaN is used, and at a rate of about 90 nm/min if TiN is used. Furthermore, dielectric 100, which includes $SiO_2$, can be removed at a rate of about 300 nm/min. In the second step of the present example, the settings for the first step can be the same, except that removal of dielectric 100 can be halted and set to a rate of zero.

Figure 25A:
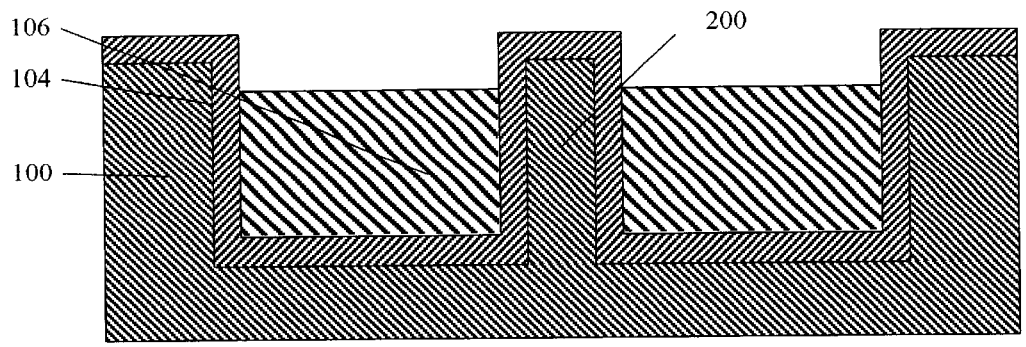
Figure 25B:
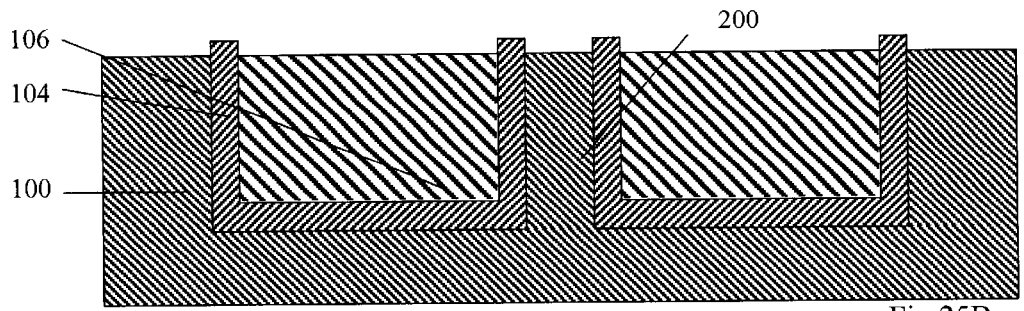
Figure 25C:
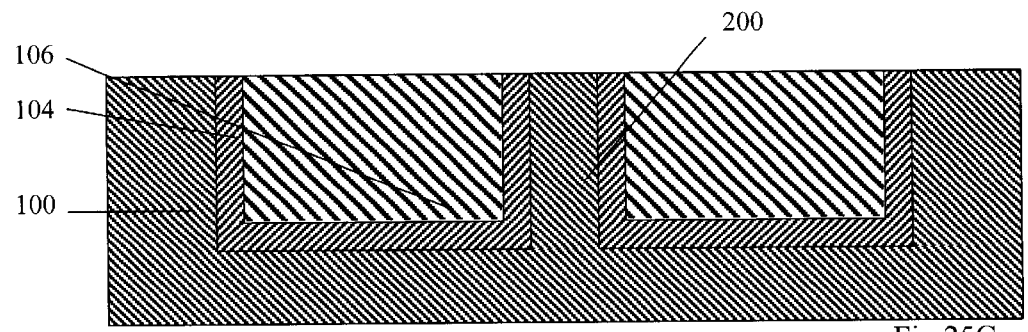
Figure 25D:
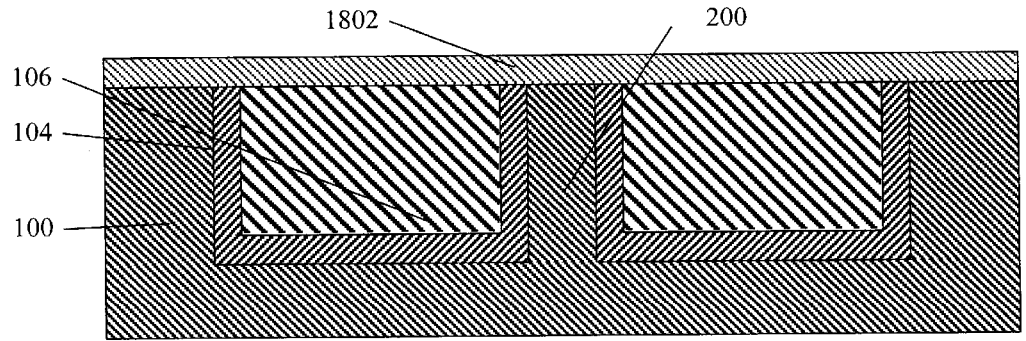

In the present exemplary embodiment, with reference to FIG. 25D, after a desired portion of barrier layer 104 and dielectric 100 is removed, cover layer 1802 can be deposited on the semiconductor device. As shown, when barrier layer 104, dielectric 100, and metal layer 106 have surfaces at the same or a similar level, gap 1800 (FIG. 18) can be eliminated, and diffusion of metal layer 106 into dielectric 100 can be reduced. Although the planarity of the semiconductor device can be better than semiconductor devices including a barrier layer 104 that protrudes beyond dielectric 100 and metal layer 106, the semiconductor device produced by the present exemplary process poses an increased risk that metal layer 106 can diffuse into dielectric 100, as compared to semiconductor devices including a barrier layer 104 that protrudes beyond dielectric 100 and metal layer 106.

FIG. 26 shows an exemplary process of removing non-recessed area 103, such that metal layer 106 protrudes beyond the level of dielectric 100 and barrier layer 104. Although the present exemplary process is not typically useful for normal wafer production, this process can be useful for producing a wafer suitable for performing electrical testing for quality control purposes or research and development. In particular, a probe used for electrical testing can more securely and easily contact the surface of metal layer 106, thereby increasing the conductivity between the pad of the semiconductor device and the probe of the electrical testing device. This increased conductivity can produce more accurate testing results.

Figure 26A:
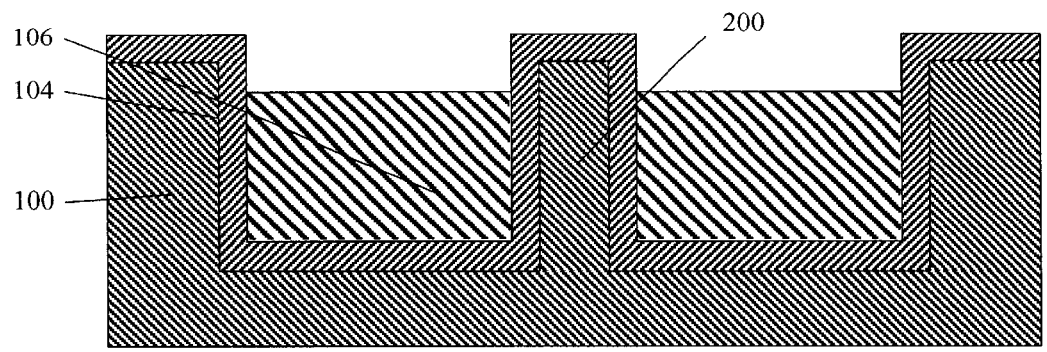
Figure 26B:
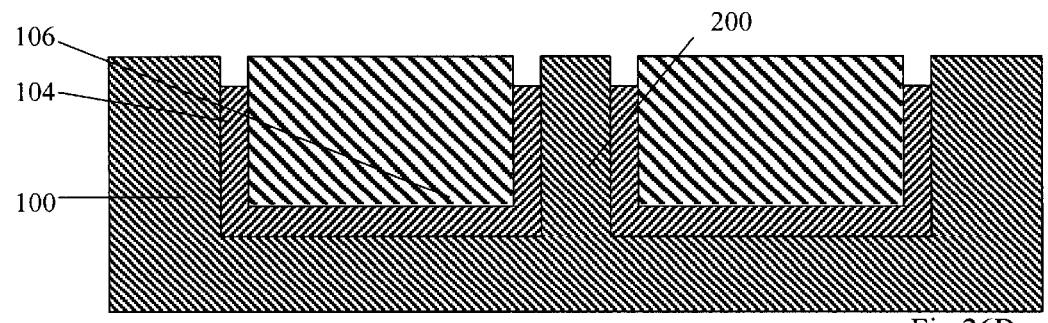
Figure 26C:
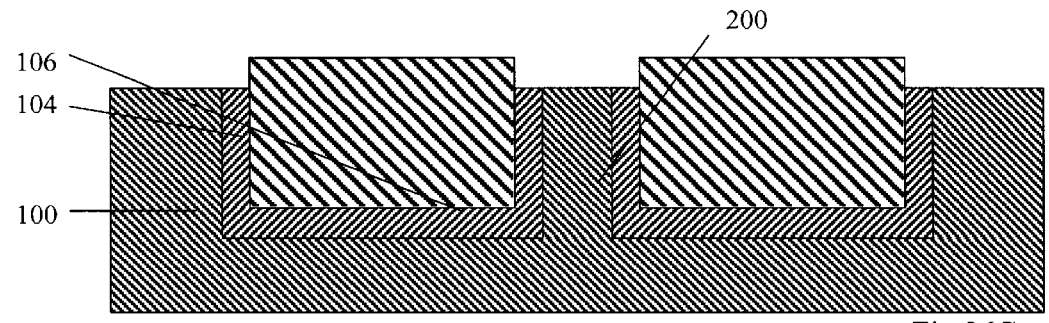

With reference to FIG. 26A, after metal layer 106 is overpolished from recessed area 102 (FIG. 18), barrier layer 104 and dielectric 100 can be removed in two steps. With reference to FIG. 26B, in the first step, barrier layer 104 can be removed at a higher rate than dielectric 100. With reference to FIG. 26C, in the second step, dielectric 100 can be removed at a higher rate while barrier layer 104 can be removed at a rate of zero. In particular, barrier layer 104 and dielectric 100 can be removed by any convenient method such as wet etching, dry chemical etching, dry plasma etching, CMP, and the like.

Figure 26D:
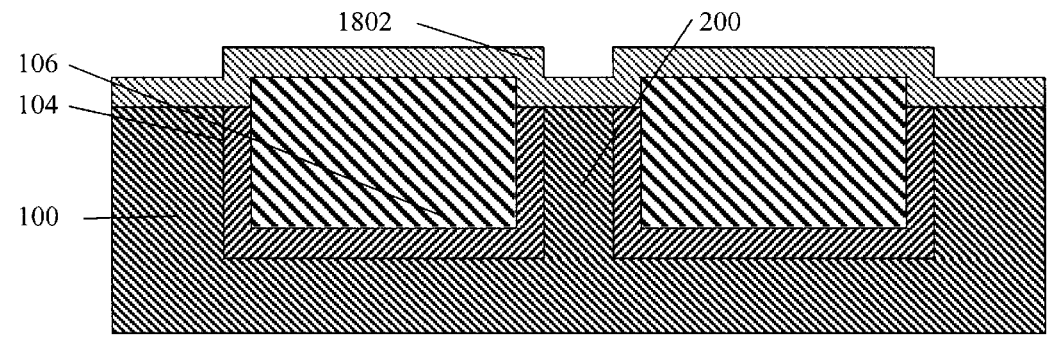

In the present exemplary process, with reference to FIG. 26D, after a desired portion of barrier layer 104 and dielectric 100 is removed, cover layer 1802 can be deposited on the semiconductor device. Cover layer 1802 can be used to protect the present layers from diffusing into subsequently formed layers.

FIG. 27 shows another exemplary process of removing non-recessed area 103, such that metal layer 106 protrudes beyond the level of dielectric 100 and barrier layer 104. Like the process depicted in FIG. 26, the present exemplary process is not typically useful for normal wafer production, but this process can be useful for producing a wafer suitable for performing electrical testing for quality control purposes or research and development. In particular, a probe used for electrical testing can more securely and easily contact the surface of metal layer 106, thereby increasing the conductivity between the pad of the semiconductor device and the probe of the electrical testing device. This increased conductivity can produce more accurate testing results.

Figure 27A:
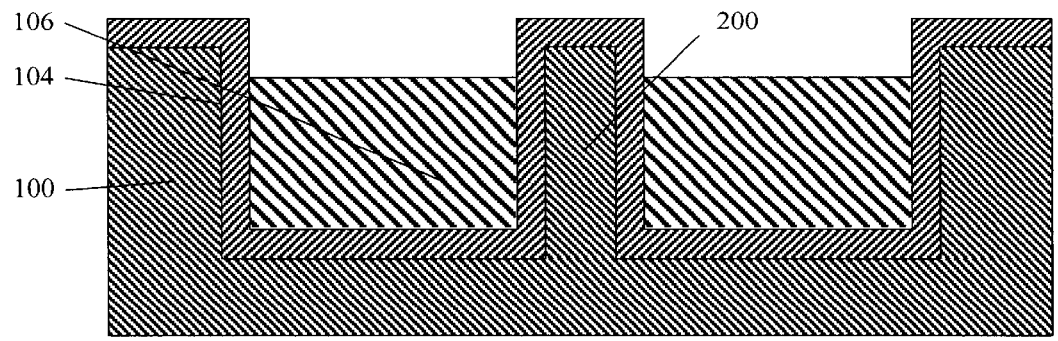
Figure 27B:
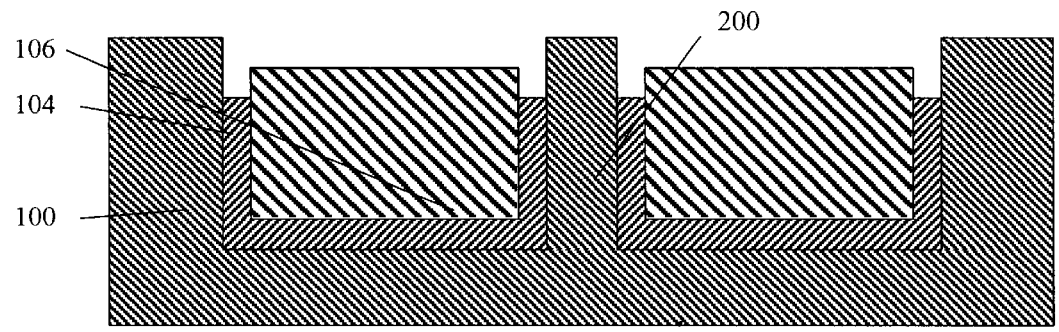
Figure 27C:
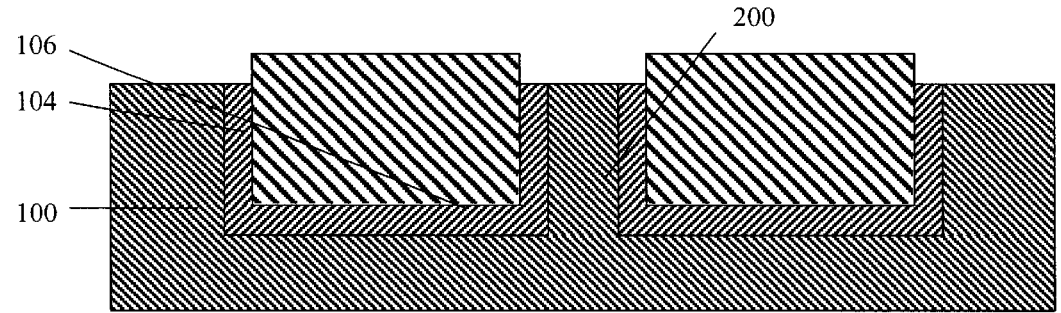

With reference to FIG. 27A, after metal layer 106 is overpolished from recessed area 102 (FIG. 18), barrier layer 104 and dielectric 100 can be removed in two steps. With reference to FIG. 27B, in the first step, barrier layer 104 can be removed at a higher rate and dielectric 100 can be removed at a rate of zero. With reference to FIG. 26C, in the second step, dielectric 100 can be removed at a higher rate while barrier layer 104 can be removed at a rate of zero. In particular, barrier layer 104 and dielectric 100 can be removed by any convenient method such as wet etching, dry chemical etching, dry plasma etching, CMP, and the like.

Figure 27D:
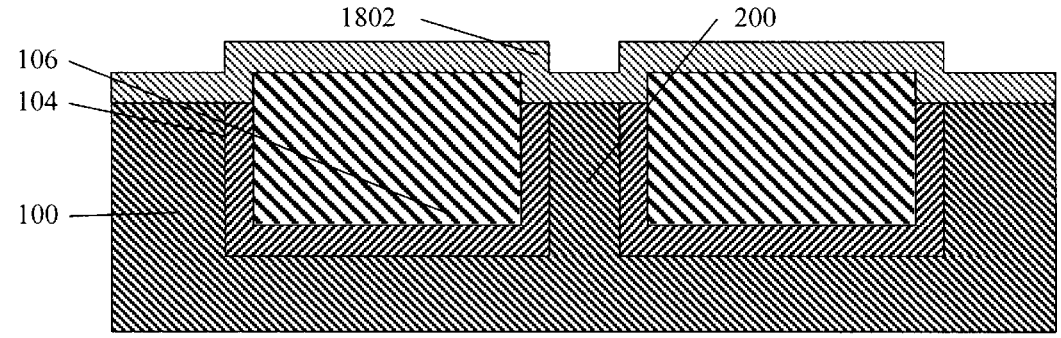

In the present exemplary embodiment, with reference to FIG. 27D, after a desired portion of barrier layer 104 and dielectric 100 is removed, cover layer 1802 can be deposited on the semiconductor device. Cover layer 1802 can be used to protect the present layers from diffusing into subsequently formed layers.

Table 1 provides a summary of the various exemplary embodiments described with regard to FIGS. 19–27. In particular, each column includes a different combination of removal rates for barrier layer 104 and dielectric 100 in the first step, and each row includes a different combination of removal rates for barrier layer 104 and dielectric 100 in the second step.

TABLE 1

|  | Step 1: Removal of barrier layer and dielectric at same rate | Step 1: Removal of barrier layer at higher rate than dielectric | Step 1: Removal of dielectric at higher rate than barrier layer |
| --- | --- | --- | --- |
| No Step 2 | FIG. 19 | N/A | FIG. 20 |
| Step 2: Removal of barrier layer and dielectric at same rate | N/A | N/A | N/A |
| Step 2: Removal of barrier layer at higher rate than dielectric | N/A | N/A | FIG. 25 |
| Step 2: Removal of dielectric at higher rate than barrier layer | FIG. 21 | FIG. 22, FIG. 23, FIG. 24, FIG. 26, FIG. 27 | N/A |

Table 1 depicts particular combinations of removal rates for dielectric 100 and barrier layer 104, however, it should be recognized that other combinations of removal rates can be used depending on the application.

Although the present invention has been described with respect to certain embodiments, examples, and applications, it will be apparent to those skilled in the art that various modifications and changes may be made without departing from the invention.

We claim:

1. A method of electropolishing a metal layer on a semiconductor wafer comprising:

forming a dielectric layer on the semiconductor wafer, wherein the dielectric layer is formed with a recessed area and a non-recessed area;

forming a plurality of dummy structures within the recessed area, wherein the dummy structures are inactive areas configured to increase the planarity of a metal layer subsequently formed on the dielectric layer;

forming a metal layer to fill the recessed area and cover the non-recessed area and the plurality of dummy structures; and electropolishing the metal layer to expose the non-recessed area.

2. The method of claim 1, wherein the recessed area has a depth corresponding to a thickness of the metal layer to remain within the recessed area after electropolishing and an offset height corresponding to a distance between a surface of the non-recessed area to be exposed after electropolishing and a surface of the metal layer to remain within the recessed area after electropolishing.

3. The method of claim 2, further comprising removing the exposed non-recessed area to a depth equal to the offset height.

4. The method of claim 3, wherein the offset height is between about 5 nanometers to about 100 nanometers.

5. The method of claim 1, wherein forming a metal layer includes depositing the metal layer.

6. The method of claim 1, wherein forming a metal layer includes electroplating the metal layer.

7. The method of claim 1,
wherein each dummy structure in the plurality has a width,
wherein the metal layer has a thickness,
wherein the thickness is based on the metal layer deposited on the non-recessed area, and
wherein a ratio of the width to the thickness is between about 0.1 to about 1.

8. The method of claim 7, wherein the ratio is 0.3.

9. The method of claim 1,
wherein dummy structures in the plurality are spaced apart from each other by a distance,
wherein the metal layer has a thickness,
wherein the thickness is based on the metal layer deposited on the non-recessed area, and
wherein a ratio of the distance to the thickness is between about 1 to about 5.

10. The method of claim 9, wherein the ratio is less than 2.

11. The method of claim 1, further comprising forming a barrier layer on the dielectric layer before forming the metal layer.

12. The method of claim 1, further comprising forming a seed layer on the dielectric layer before forming the metal layer.

13. The method of claim 1, further comprising forming a cover layer on the semiconductor wafer after electropolishing the metal layer.

14. The method of claim 1, wherein the recessed area is a wide trench configured to form an interconnection when filled with the metal layer.

15. The method of claim 1, wherein the recessed area is a large rectangular structure configured to form a pad when filled with the metal layer.

16. The method of claim 15, further comprising removing the exposed non-recessed area beyond a surface of the electropolished metal layer to form a pad that protrudes beyond the dielectric layer to facilitate contact between the pad and a probe used for electrical testing.

17. The method of claim 15, wherein the large rectangular structure has rounded corners.

18. The method of claim 1, wherein the metal layer is copper.

19. The method of claim 1, wherein the plurality of dummy structures includes the same material as the dielectric layer.

20. The method of claim 1, wherein the plurality of dummy structures includes a metal.

21. A method of electropolishing a metal layer on a semiconductor wafer comprising:
forming a dielectric layer on the semiconductor wafer,
wherein the dielectric layer is formed with a recessed area and a non-recessed area;
forming a plurality of dummy structures within the recessed area,
wherein the plurality of dummy structures are inactive areas configured to increase the planarity of a metal layer subsequently formed on the dielectric layer;
forming a barrier layer to cover the recessed area, the non-recessed area, and the plurality of dummy structures;
forming a metal layer to fill the recessed area and cover the non-recessed area and the plurality of dummy structures;
electropolishing the metal layer to expose the barrier layer deposited on the non-recessed area;
removing the exposed barrier layer at a first rate; and
removing the non-recessed area of the dielectric layer at a second rate.

22. The method of claim 21, wherein the exposed barrier layer and the non-recessed area of the dielectric layer have even surfaces after the exposed barrier layer is removed at a first rate and the non-recessed area of the dielectric layer is removed at a second rate.

23. The method of claim 21, wherein the exposed barrier layer protrudes beyond the non-recessed area after the exposed barrier layer is removed at a first rate and the non-recessed area is removed at a second rate.

24. The method of claim 21, wherein the first rate is equal to the second rate.

25. The method of claim 21, wherein the first rate is lower than the second rate.

26. The method of claim 21, further comprising:
removing the exposed barrier layer at a third rate; and
removing the non-recessed area of the dielectric at a fourth rate.

27. The method of claim 26, wherein the third rate is higher than the fourth rate.

28. The method of claim 27, wherein the fourth rate is zero.

29. The method of claim 26, wherein the fourth rate is higher than the third rate.

30. The method of claim 29, wherein the third rate is zero.

31. The method of claim 26, wherein the first rate is higher than the second rate.

32. The method of claim 26, wherein the exposed barrier layer and the non-recessed area have even surfaces after the exposed barrier layer is removed at a third rate and the non-recessed area is removed at a fourth rate.

33. The method of claim 26, wherein the exposed barrier layer protrudes beyond the non-recessed area after the exposed barrier layer is removed at a third rate and the non-recessed area is removed at a fourth rate.

34. The method of claim 21,
wherein each dummy structure in the plurality has a width,
wherein the metal layer has a thickness,
wherein the thickness is based on the metal layer deposited on the non-recessed area, and
wherein a ratio of the width to the thickness is between about 0.1 to about 1.

35. The method of claim 21,
wherein dummy structures in the plurality are spaced apart from each other by a distance,
wherein the metal layer has a thickness,
wherein the thickness is based on the metal layer deposited on the non-recessed area, and
wherein a ratio of the distance to the thickness is between about 1 to about 5.

36. The method of claim 21, further comprising depositing a seed layer on the dielectric layer before depositing the metal layer.

37. The method of claim 21, further comprising depositing a cover layer on the semiconductor wafer after electropolishing the metal layer.

38. The method of claim 21,
wherein the recessed area is a wide trench configured to form an interconnection when filled with the metal layer.

39. The method of claim 21, wherein the recessed area is a large rectangular structure configured to form a pad when filled with the metal layer.

40. The method of claim 39, further comprising removing the exposed barrier layer and the non-recessed area of the dielectric beyond the surface of the metal layer to form a pad that protrudes beyond the dielectric layer to facilitate contact between the pad and a probe used for electrical testing.

41. The method of claim 39, wherein the large rectangular structure has rounded corners.

42. The method of claim 21, wherein the metal layer is copper.

43. The method of claim 21, wherein the plurality of dummy structures includes the same material as the semiconductor wafer.

44. The method of claim 21, wherein the plurality of dummy structures includes a metal.

45. The method of claim 21, wherein forming a metal layer includes depositing the metal layer.

46. The method of claim 21, wherein forming a metal layer includes electroplating the metal layer.

47. A method of electropolishing a metal layer on a semiconductor wafer comprising:
forming a dielectric layer on the semiconductor wafer, wherein the dielectric layer is formed with a recessed area and a non-recessed area;
forming at least one dummy structure within the recessed area;
forming a metal layer to cover the dummy structure and the non-recessed area and fill the recessed area; and
overpolishing the metal layer from the recessed and non-recessed areas to expose the non-recessed area, wherein the overpolishing allows the non-recessed area to protrude past a surface of the metal layer in the recessed area.

48. The method of claim 47, further comprising removing a portion of the non-recessed area that protrudes past the surface.

49. The method of claim 48, wherein the portion of the non-recessed area removed has a thickness of between about 5 to about 100 nanometers.

50. The method of claim 47, wherein forming a metal layer includes depositing the metal layer.

51. The method of claim 47, wherein forming a metal layer includes electroplating the metal layer.

52. The method of claim 47,
wherein the dummy structure has a width,
wherein the metal layer has a thickness,
wherein the thickness is based on the metal layer deposited on the non-recessed area, and
wherein a ratio of the width to the thickness is between about 0.1 to about 1.

53. The method of claim 52, wherein the ratio is 0.3.

54. The method of claim 47,
wherein the dummy structure is spaced apart from the non-recessed area by a distance,
wherein the metal layer has a thickness,
wherein the thickness is based on the metal layer deposited on the non-recessed area, and
wherein a ratio of the distance to the thickness is between about 1 to about 5.

55. The method of claim 47, further comprising forming a barrier layer on the dielectric layer before forming the metal layer.

56. The method of claim 47, further comprising forming a seed layer on the dielectric layer before forming the metal layer.

57. The method of claim 47, further comprising forming a cover layer on the semiconductor wafer after electropolishing the metal layer.

58. The method of claim 47, wherein the recessed area is a wide trench configured to form an interconnection when filled with the metal layer.

59. The method of claim 47, wherein the recessed area is a large rectangular structure configured to form a pad when filled with the metal layer.

60. The method of claim 59, further comprising removing the exposed non-recessed area beyond the surface of the metal layer to form a pad that protrudes beyond the dielectric layer to facilitate contact between the pad and a probe used for electrical testing.

61. The method of claim 47, wherein the metal layer is copper.

62. The method of claim 48, wherein the dummy structure includes the same material as the dielectric layer.

63. The method of claim 47, wherein the dummy structure includes a metal.

64. A method of electropolishing a metal layer on a semiconductor wafer comprising:
forming a dielectric layer on the semiconductor wafer, wherein the layer is formed with a recessed area, a non-recessed area, and a plurality of dummy structures disposed within the recessed area,
wherein the dummy structures are inactive areas configured to increase the planarity of a metal layer subsequently formed on the layer;
forming a metal layer to fill the recessed area and cover the non-recessed area and the dummy structures; and
electropolishing the metal layer to expose the non-recessed area.

65. The method of claim 64, further comprising:
overpolishing the metal layer beyond the surface of the exposed non-recessed area; and
removing a portion of the exposed non-recessed area that is uneven with the metal layer in the recessed area after electropolishing.

66. The method of claim 65, wherein the portion of the non-recessed area removed has a thickness of between about 5 nanometers to about 100 nanometers.

67. The method of claim 64, wherein forming a metal layer includes depositing the metal layer.

68. The method of claim 64, wherein forming a metal layer includes electroplating the metal layer.

69. The method of claim 64,
wherein each dummy structure in the plurality has a width,
wherein the metal layer has a thickness,
   wherein the thickness is based on the metal layer deposited on the non-recessed area, and
wherein a ratio of the width to the thickness is between about 0.1 to about 1.

70. The method of claim 69, wherein the ratio is 0.3.

71. The method of claim 64,
wherein dummy structures in the plurality are spaced apart from each other by a distance,
wherein the metal layer has a thickness,
   wherein the thickness is based on the metal layer deposited on the non-recessed area, and
wherein a ratio of the distance to the thickness is between about 1 to about 5.

72. The method of claim 71, wherein the ratio is less than 2.

73. The method of claim 64, further comprising forming a barrier layer on the dielectric layer before forming the metal layer.

74. The method of claim 64, further comprising forming a seed layer on the dielectric layer before forming the metal layer.

75. The method of claim 64, further comprising forming a cover layer on the semiconductor wafer after electropolishing the metal layer.

76. The method of claim 64, wherein the recessed area is a wide trench configured to form an interconnection when filled with the metal layer.

77. The method of claim 64, wherein the recessed area is a large rectangular structure configured to form a pad when filled with the metal layer.

78. The method of claim 77, further comprising removing the exposed non-recessed area beyond the surface of the metal layer in the recessed area to form a pad that protrudes beyond the dielectric layer to facilitate contact between the pad and a probe used for electrical testing.

79. The method of claim 77, wherein the large rectangular structure has rounded corners.

80. The method of claim 64, wherein the metal layer is copper.

81. The method of claim 64, wherein the plurality of dummy structures includes the same material as the dielectric layer.

82. The method of claim 64, wherein the plurality of dummy structures includes a metal.

* * * * *